(12) United States Patent
Ida et al.

(10) Patent No.: US 6,798,320 B2
(45) Date of Patent: Sep. 28, 2004

(54) MICROSTRIP LINE HAVING A LINE ELECTRODE WITH INTEGRAL EDGE ELECTRODES

(75) Inventors: Yutaka Ida, Yokohama (JP); Yoshikazu Yagi, Shiga-ken (JP); Tsutomu Ieki, Yokohama (JP); Hiroaki Tanaka, Osaka-fu (JP); Osamu Chikagawa, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 67 days.

(21) Appl. No.: 10/059,623

(22) Filed: Jan. 29, 2002

(65) Prior Publication Data

US 2002/0135444 A1 Sep. 26, 2002

(30) Foreign Application Priority Data

Jan. 29, 2001 (JP) ........................................ 2001-020436
Jan. 9, 2002 (JP) ........................................ 2002-002445

(51) Int. Cl.$^7$ ............................................... H01P 3/08
(52) U.S. Cl. ......................... 333/238; 333/219; 333/204
(58) Field of Search .................................. 333/238, 219, 333/204

(56) References Cited

U.S. PATENT DOCUMENTS

| 5,834,995 A | * 11/1998 | Richards et al. ............ 333/238 |
| 6,041,245 A | * 3/2000 | Mansour ..................... 505/210 |
| 6,144,268 A | * 11/2000 | Matsui et al. ........... 333/238 X |
| 2001/0033210 A1 | 10/2001 | Tanabe |

FOREIGN PATENT DOCUMENTS

| EP | 0 917 236 A2 | 5/1999 | |
| GB | 2 320 370 A | 6/1998 | |
| JP | 6283907 | * 10/1994 | ................. 333/238 |

* cited by examiner

*Primary Examiner*—Benny Lee
(74) *Attorney, Agent, or Firm*—Keating & Bennett, LLP

(57) ABSTRACT

A microstrip line includes a strip conductor, a line electrode, and edge electrodes provided at the edges on both sides of the line electrode. The construction of the microstrip line greatly reduces the edge effect of the line electrode and decreases the conductor loss of the line electrode.

12 Claims, 18 Drawing Sheets

US 6,798,320 B2

MICROSTRIP LINE HAVING A LINE ELECTRODE WITH INTEGRAL EDGE ELECTRODES

BACKGROUND OF THE INVENTION

1. Field of the Invention

The present invention relates to a microstrip line, a resonator element, a filter, and a high-frequency circuit that utilize the microstrip line, and to an electronic circuit, circuit module, and communications device that utilize the resonator device, filter, and high-frequency circuit.

2. Description of the Related Art

In small electronic devices having microwave or milliwave circuitry, a microstrip line, as shown in FIG. 23, is generally used as a transmission line for transmitting signals having frequencies in the microwave or milliwave band. FIG. 23 shows a portion of a microstrip line 1 that includes a dielectric substrate 2, a ground electrode 4 provided on the back 3 of the dielectric substrate 2, and a flat line electrode 6 provided on the front 5 of the dielectric substrate 2.

It is well-known that most of the line transmission loss in the microstrip line 1 is conductor loss attributable to the concentration of current at the edges 7 and 8 of the line electrode 6, and that an "edge effect" exists (R. A. Pucel, "Losses in Microstrip," IEEE Trans. on MTT, Vol. MTT-16, June 1968, pp. 342–350). Conductor loss is greater when the line electrode 6 is narrow. Consequently, it is difficult to produce an electronic circuit having highly integrated microstrip lines 1 and very narrow line electrodes 6.

An effective way to improve this situation is to increase the thickness of the line electrode 6 and to reduce the current density at the edges 7 and 8 of the line electrode 6. FIGS. 24A and 24B are graphs of the transmission characteristics (calculated) for the microstrip line 1 when the thickness of the line electrode 6 is varied. In FIG. 24A, Qo is the resonance when the microstrip line 1 is cut to a specific length and made into a resonator. The value of Qo increases as the conductor loss of the line electrode 6 decreases. In FIG. 24B, Zo is the characteristic impedance of the microstrip line 1, and $K_{off}$ is the effective dielectric constant of the dielectric substrate 2.

The microstrip line 1 used in the calculation of transmission characteristics for FIGS. 24A and 24B was configured such that the dielectric constant of the dielectric substrate 2 was 38, the thickness of the dielectric substrate 2 was 300 $\mu$m, and the width of the line electrode 6 was 20 $\mu$m. As is clear from FIGS. 24A and 24B, when the thickness of the line electrode 6 is varied over a range of 1 $\mu$m to 25 $\mu$m, the characteristic impedance Zo and the effective dielectric constant Keff changes very little. In contrast, the Qo value increases in proportion to the thickness of the line electrode 6, which indicates that the conductor loss decreases.

A problem, however, is that when the thickness of the line electrode 6 is increased, the precision of the electrode pattern of the electronic circuit decreases. Consequently, there have been attempts at decreasing the edge-effect without increasing the thickness of the line electrode 6. The following is a conventional example of such attempts.

The microstrip line shown in FIG. 25 is discussed in "Multilayered MMIC, V-Groove Microstrip Line Characteristics," by Hasegawa et al., 1990 Electronic Information Communications Society, National Fall Conference, lecture C-55. A microstrip line 10 has a V-shaped groove 13 provided on the front 12 of a dielectric substrate 11, and a V-shaped line electrode 14 having a crease 15 is provided in the middle of this groove 13. As a result, the electric field is concentrated between the V-shaped lower end portion of the line electrode 14 and a ground electrode 16 provided on the back of the dielectric substrate 11, thereby reducing the concentration of current at the edges 17 and 18 of the line electrode 14.

Japanese Laid-Open Patent Application 10-313203 discloses a microstrip line in which a groove is provided in a dielectric substrate to reduce the transmission loss of high-frequency signals. As shown in FIG. 26, this microstrip line 20 is designed such that a flat line electrode 23 is provided on the front 22 of a dielectric substrate 21, a V-shaped groove 25 is provided on the back 24 of the dielectric substrate 21 at a location across from the line electrode 23, and a ground electrode 26 is provided to include the groove 25. With this configuration, an electric field is concentrated between the line electrode 23 and the ground electrode 26 in the V-shaped portion 27 of the ground electrode 26, which reduces the concentration of current at the edges 28 and 29 of the line electrode 23.

Furthermore, Japanese Laid-Open Patent Application 8-288463 discloses a microstrip line in which the transmission loss of the line is decreased by utilizing a skin effect. As shown in FIG. 27, this microstrip line 30 includes a ground electrode 33 provided on the back 32 of a dielectric substrate 31, and a line electrode 38 provided on the front 34 of the dielectric substrate 31, on the sides 35 and 36 of the line electrode 38 a plurality of grooves 37 are provided. This expands the surface area of the sides 35 and 36 of the line electrode 38, thereby increasing surface current at the sides 35 and 36 and reducing transmission loss.

Nevertheless, with the microstrip line 10 in FIG. 25, it is difficult to form the V-shaped groove 13 with high precision in the dielectric substrate 11, and with the microstrip line 20 in FIG. 26, it is difficult to machine the V-shaped groove 25 with high precision in the dielectric substrate 21. Moreover, the configurations of these microstrip lines 10 and 20 do not provide the benefit of greatly increasing the Qo value of the microstrip line. With the microstrip line 30 in FIG. 27, the method of forming the line electrode 38 is complicated and the manufacturing costs are high.

SUMMARY OF THE INVENTION

To overcome the above-described problems, preferred embodiments of the present invention provide a microstrip line that reduces the edge effect of the line electrode, a high frequency circuit and a resonator device including the microstrip line that reduces the edge effect of the line electrode, a filter including the resonator device, an electronic circuit constituted including this filter, a circuit module including this electronic circuit, and a communications device including these devices.

A microstrip line according to a second preferred embodiment includes a dielectric substrate, a ground electrode provided on the back of the dielectric substrate, and a line electrode provided on the front of the dielectric substrate, and edge electrodes provided at the edges on both sides of the line electrode. The edge electrodes extend in a direction that is substantially perpendicular to the front of the dielectric substrate.

With the microstrip line according to the second preferred embodiment, the reduction in transmission loss in the microstrip line is proportional to the height of the edge electrodes. However, when short edge electrodes are provided on the line electrode, the line electrode and edge electrodes can be provided with high precision using thin film forming methods.

A microstrip line according to a third preferred embodiment includes a dielectric substrate, a ground electrode provided on the back of the dielectric substrate, and a line electrode provided on the front of the dielectric substrate, and edge electrodes provided at the edges on both sides of the line electrode. The edge electrodes are preferably arranged at an angle with respect to the front of the dielectric substrate.

With the microstrip line according to the third preferred embodiment, even though the edge electrodes are arranged at an angle to the front of the dielectric substrate over their entire length, there is a reduction in the conductor loss of the microstrip line, corresponding to the length from the front of the dielectric substrate to the tops of the edge electrodes, and the edge effect of the microstrip line is greatly reduced.

A microstrip line according to a fourth preferred embodiment further includes a pair of reinforcing components made of a material having a small dielectric loss and provided on the front of the dielectric substrate to support the edge electrodes.

The edge electrodes are provided utilizing the sides of the reinforcing components, and because the edge electrodes are structurally stable, they can be made taller than the thickness of the line electrode, allowing the effect of reducing transmission loss to be further improved. Also, a material with a dielectric loss that is about the same as or considerably less than the dielectric loss of the dielectric substrate is used as an insulating material that forms the reinforcing components, which prevents the dielectric loss from increasing due to the addition of the reinforcing components.

According to a fifth preferred embodiment, the reinforcing components are preferably defined by insulating films made of a resin material. This is particularly effective when it is necessary to suppress an increase in dielectric loss in the microstrip line while performing fine machining at a narrow line electrode width.

According to a sixth preferred embodiment, the reinforcing components may be made of a ceramic material. This is particularly effective when a wide line electrode and tall edge electrodes are provided to achieve a high Q value of the microstrip line. For instance, it is possible to produce a microstrip line having a large strip conductor in which the line electrode width is approximately 140 $\mu$m and the edge electrodes are approximately several hundred microns tall. This further reduces transmission loss.

The microstrip line according to a seventh preferred embodiment further includes a line groove provided between the pair of reinforcing components, with the front of the dielectric substrate defining the bottom of the groove, this line groove has sides that are substantially perpendicular to the front of the dielectric substrate. The line electrode is provided at the bottom of the line groove, edge electrodes are linked along the entire length of the line electrode, and the edges of the line electrode are provided on the sides of the line groove. This makes it easier to form the strip conductor.

The microstrip line according to a eighth preferred embodiment of the present invention further includes a line groove is provided between the pair of reinforcing components, with the front of the dielectric substrate defining the bottom of the groove, the line groove has sides that are inclined with respect to the front of the dielectric substrate. The line electrode is provided at the bottom of the line groove, edge electrodes that are linked along the entire length of the line electrode, and the edges of the line electrode are provided on the sides of the line groove. This makes it easier to form the strip conductor.

The microstrip line according to a ninth preferred embodiment includes edge electrodes having a flat portion extending substantially parallel to the front of the dielectric substrate along the top of the reinforcing components. This enhances the dimensional precision of the edge electrodes.

The microstrip line according to a tenth preferred embodiment includes a portion of the line electrode extending between the reinforcing components and the front of the dielectric substrate. This enhances the dimensional precision of the line electrode.

The microstrip line according to an eleventh preferred embodiment further includes a flat electrode that links the upper ends of the pair of edge electrodes. As a result, the strip conductor has a hollow construction, and it is possible to increase the surface current of the strip conductor.

The microstrip line according to a twelfth preferred embodiment wherein a space surrounded by the line electrode, the flat electrode, and the edge electrodes are filled with a filler having a small dielectric loss tangent. This makes it easier to produce a strip conductor having a transmission loss that is about the same as that of the strip conductor of the eleventh preferred embodiment, in which the interior was hollow, while still reducing the edge effect.

DETAILED DESCRIPTION OF PREFERRED EMBODIMENTS

Figure 1:
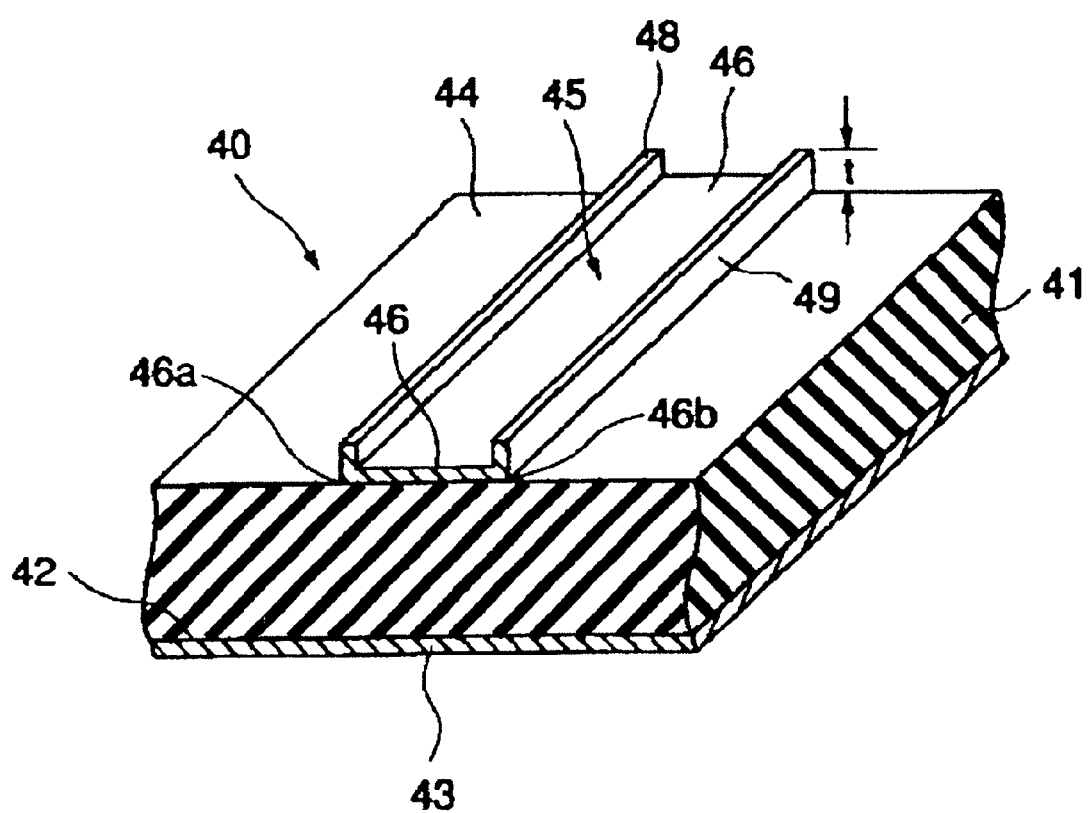
FIG. 1 is a cross sectional oblique view illustrating a first preferred embodiment of the microstrip line according to the present invention.

Preferred embodiments of the present invention will now be described with reference to the drawings. FIG. 1 illustrates a first preferred embodiment of the microstrip line pertaining to the present invention.

In FIG. 1, a microstrip line 40 preferably includes a dielectric substrate 41, a ground electrode 43 provided over substantially the entire back 42 of the dielectric substrate 41, and a strip conductor 45 provided on the front 44 of the dielectric substrate 41.

The strip conductor 45 includes a flat line electrode 46 having a slender shape and a specified width on the front 44 of the dielectric substrate 41, and edge electrodes 48 and 49 provided at the edges 46a and 46b on both sides of the line electrode 46 and along the entire length thereof. The length of the line electrode 46 is determined after taking into account the wavelength shortening effect attributable to the dielectric constant of the dielectric substrate 41. The edge electrodes 48 and 49 are substantially perpendicular to the front 44 of the dielectric substrate 41 at an angle of about 90 degrees from the front 44 of the dielectric substrate 41.

Providing the above-mentioned edge electrodes 48 and 49 has the same effect as increasing the thickness of the edges 46a and 46b of the line electrode 46. In other words, the edge electrodes 48 and 49 disperse the high frequency current concentrated at the edges 46a and 46b of the line electrode 46, and greatly reduce transmission loss in the strip conductor 45.

A specific example of the microstrip line 40 will now be described. The dielectric substrate 41 has a thickness of about 300 $\mu$m and a dielectric constant of about 38. The line electrode 46 provided on the front 44 of the dielectric substrate 41 is about 5 $\mu$m thick and about 20 $\mu$m wide. The width (about 20 $\mu$m) of the line electrode 46 is for the portion where the line electrode 46 is in contact with the front 44 of the dielectric substrate 41 in a lateral cross section of the line electrode 46. The edge electrodes 48 and 49 are about 5 $\mu$m thick in the horizontal direction, and their height from the front 44 of the dielectric substrate 41 (the length of the outer surface from the front 44 to the top) is about t $\mu$m.

Figure 2A:
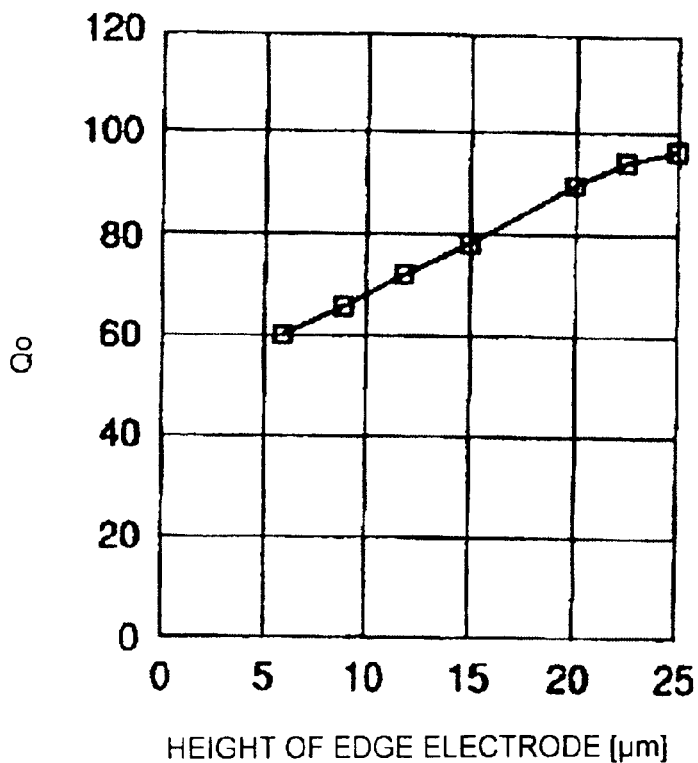
FIGS. 2A and 2B shows the transmission characteristics of the microstrip line in FIG. 1, with FIG. 2A being a graph of the Qo value versus the height of the edge electrodes, and FIG. 2B a graph of the characteristic impedance and effective dielectric constant versus the height of the edge electrodes.
Figure 2B:
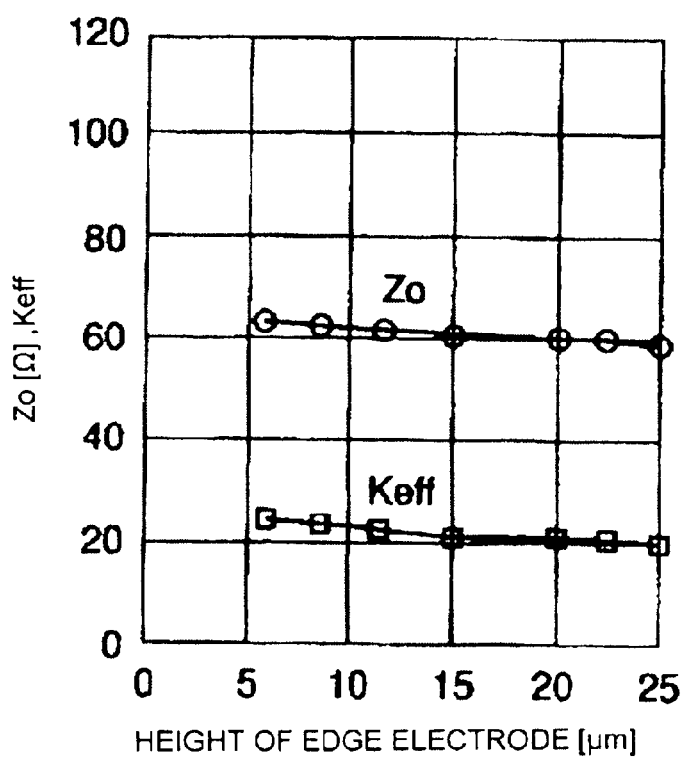

FIG. 2 shows the transmission characteristics of the microstrip line 40 when the height of the edge electrodes 48 and 49 (the variable t) is varied between about 6 $\mu$m and about 25 $\mu$m. FIG. 2A shows the Qo value of the microstrip line 40, while FIG. 2B shows the characteristic impedance Zo of the microstrip line 40 and the effective dielectric constant Keff of the dielectric substrate 41. The Qo value of the microstrip line 40 is the resonance Qo when the microstrip line 40 is cut to a specific length and made into a resonator. The initial value of Qo is given by the thickness of the dielectric substrate 41 and the width of the line electrode 46.

As is clear from FIGS. 2A and 2B, as the height t of the edge electrodes 48 and 49 increases, the Qo value of the microstrip line 40 increases, which indicates that there is a decrease in the conductor loss in the strip conductor 45. Also, even when the height t of the edge electrodes 48 and 49 is increased, the characteristic impedance Zo of the microstrip line 40 and the effective dielectric constant Keff of the dielectric substrate 41 remain substantially the same.

Figure 24A:
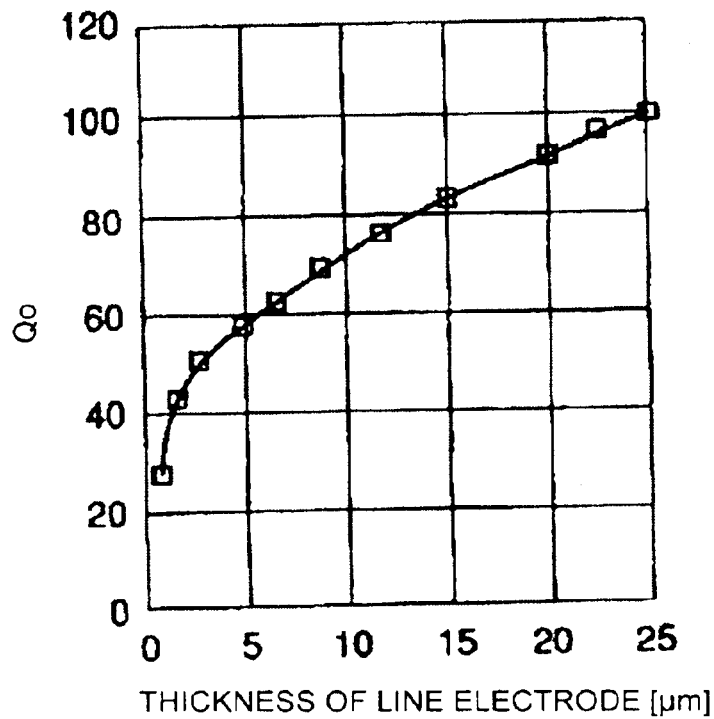
FIGS. 24A and 24B shows the transmission characteristics of the microstrip line in FIG. 23, with FIG. 24A being a graph of the Qo value versus the thickness of the line electrode, and FIG. 24B being a graph of the characteristic impedance and effective dielectric constant versus the thickness of the line electrode.
Figure 24B:
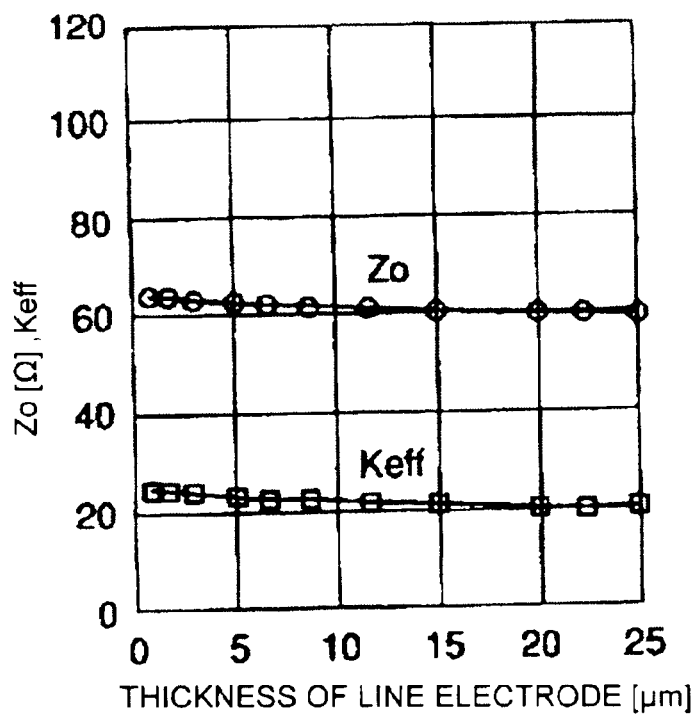
Figure 25:
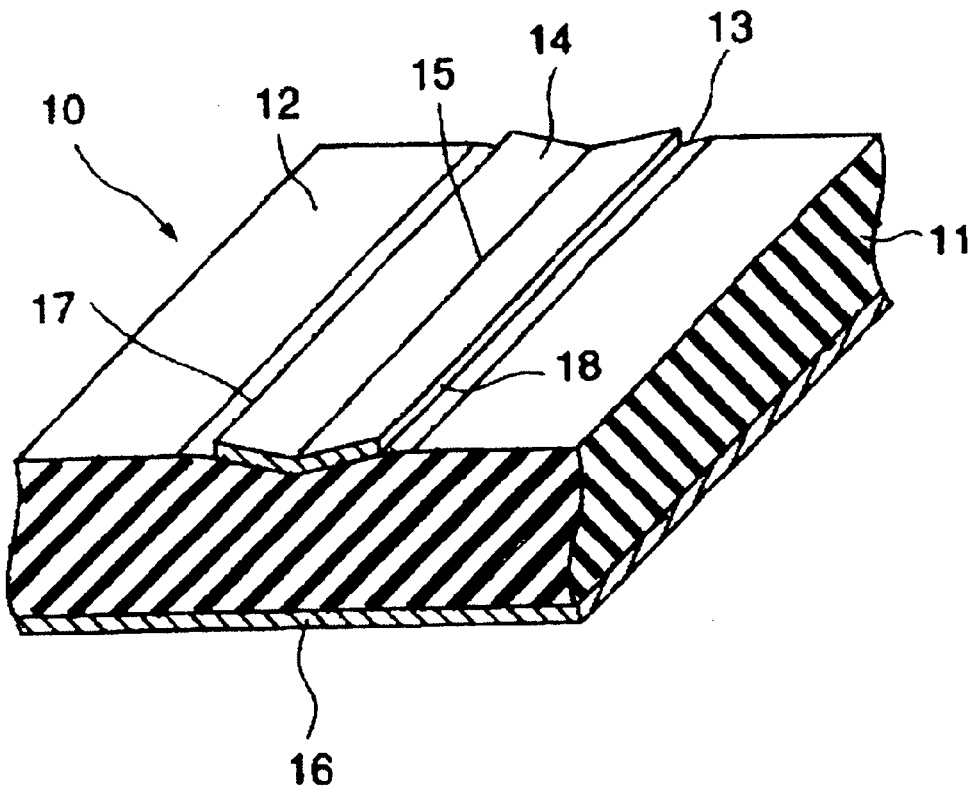
FIG. 25 is a cross sectional oblique view of another aspect of a conventional microstrip line.
Figure 26:
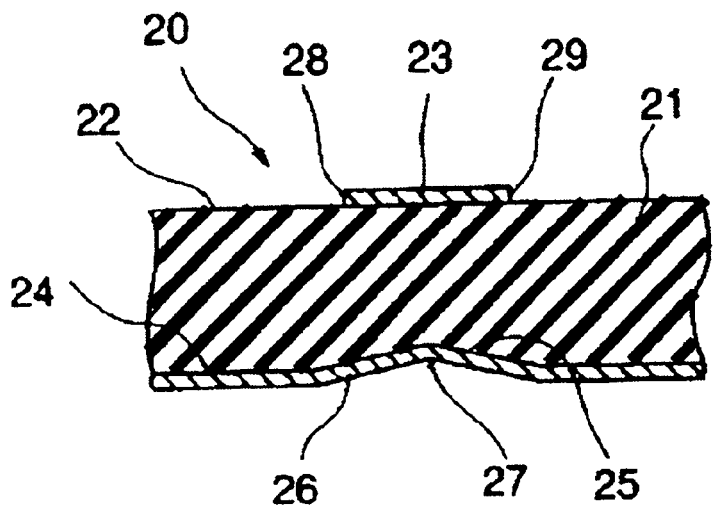
FIG. 26 is a cross sectional oblique view of yet another aspect of a conventional microstrip line.
Figure 27:
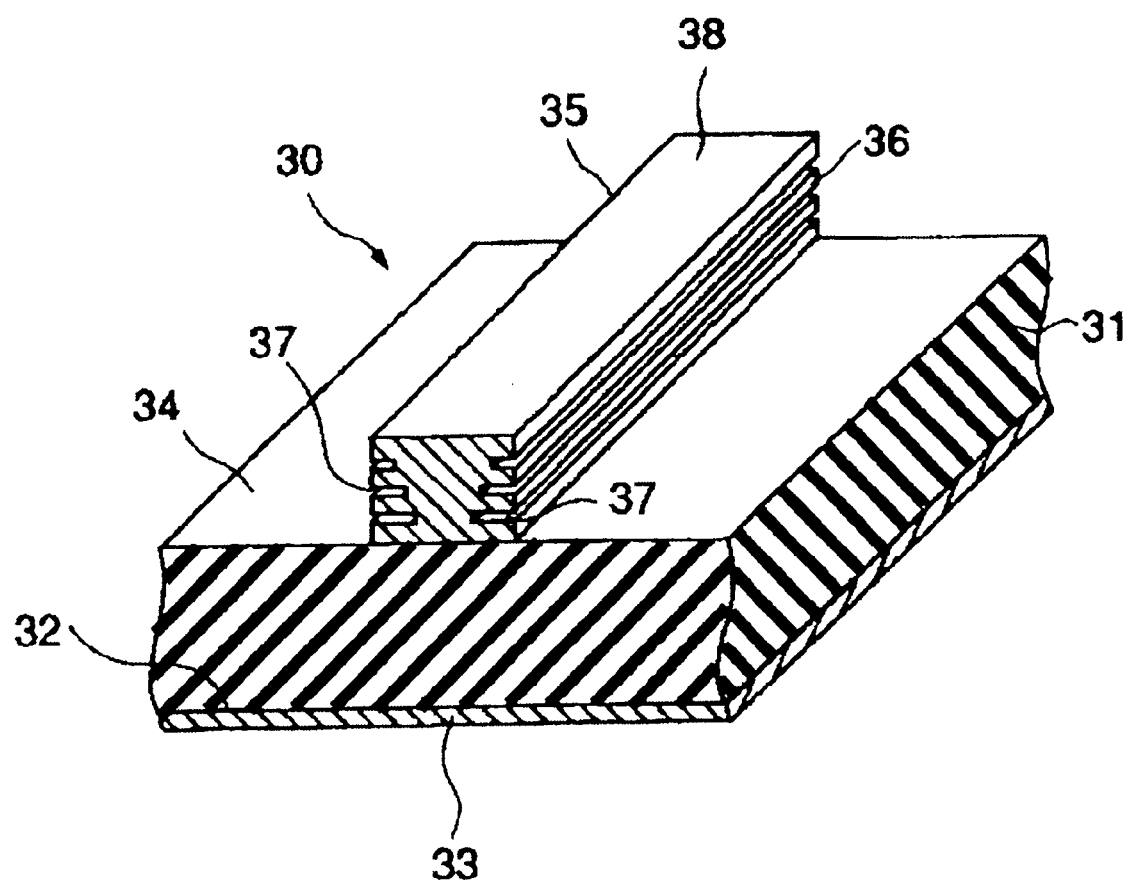
FIG. 27 is a cross sectional oblique view of yet another aspect of a conventional microstrip line.

When the transmission characteristics of the microstrip line 40 shown in FIGS. 2A and 2B are compared to the transmission characteristics of the microstrip line in FIGS. 24A and 24B (conventional example), the increase in the Qo value of the microstrip lines exhibits substantially the same tendency. We can conclude from this that the edge electrodes 48 and 49 of the strip conductor 45 have the same effect as increasing the thickness of the line electrode 46, and that the edge effect of the line electrode 46 is greatly reduced by the edge electrodes 48 and 49.

The ground electrode 43 and the strip conductor 45 are formed by thin film formation technology using a good conductor such as copper, silver, or gold, or other suitable material, such that the dimensions of these components (e.g., thickness, width, and height) are set with high precision, and variances in the characteristic impedance Zo of the microstrip line 40 and variance in conductor loss in the microstrip line 40 are minimized during manufacture.

Figure 3:
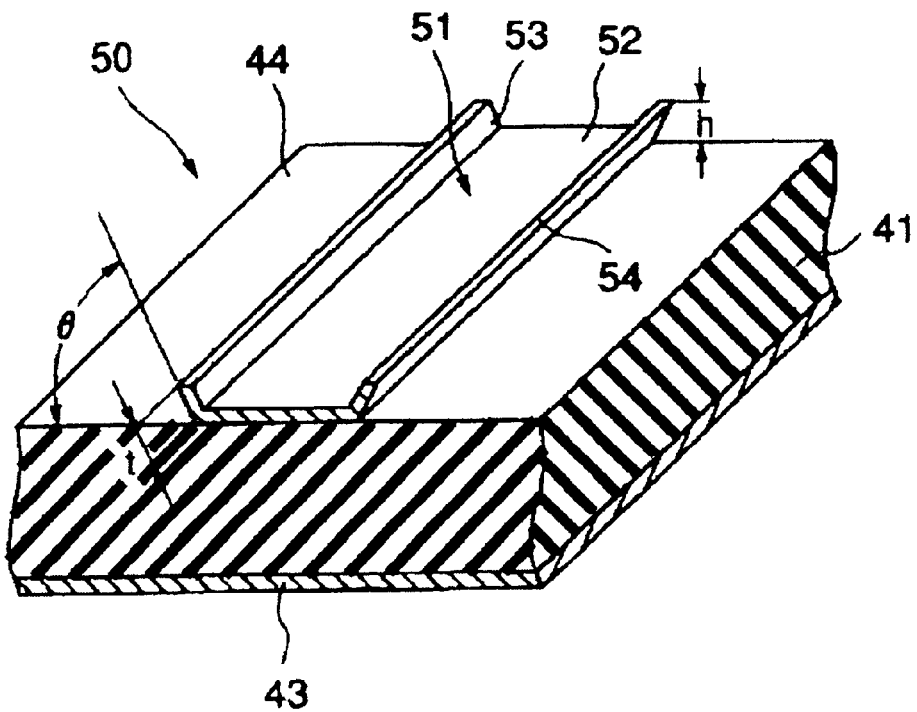
FIG. 3 is a cross sectional oblique view illustrating a second preferred embodiment of the microstrip line according to the present invention.

FIG. 3 illustrates a second preferred embodiment of the microstrip line pertaining to the present invention. Those components that are the same as in the first preferred embodiment are numbered the same, and redundant descriptions of common portions are omitted. The characteristic feature of this preferred embodiment is that the edge electrodes are arranged at an angle with respect to the front of the dielectric substrate.

In FIG. 3, a strip conductor 51 of a microstrip line 50 includes a line electrode 52 and edge electrodes 53 and 54 provided at the edges on both sides of the line electrode 52 and inclined over their entire length. Specifically, in the cross sectional shape of a strip conductor 56, the edge electrodes 53 and 54 provided on either side are disposed at a specific angle θ with respect to the front 44 of the dielectric substrate 41 such that they extend farther apart toward the top. The specific angle θ is greater than 0 degrees but less than about 90 degrees with respect to the front 44 of the dielectric substrate 41 (900°>θ>0°).

The length of the outer surfaces of the edge electrodes 53 and 54, that is, the length from the front 44 of the dielectric substrate 41 to the top of the edge electrodes 53 and 54, is preferably about t μm, just as in the first preferred embodiment. The thickness in the direction perpendicular to the outer surface of the edge electrodes 53 and 54 is about 5 μm. The height h of the edge electrodes 53 and 54 (with respect to the front 44 of the dielectric substrate 41) is the height when the inclined edge electrodes 53 and 54 are projected onto a plane that is substantially perpendicular to the front 44 of the dielectric substrate 41 (h=t sin θ).

The strip conductor 51 achieves the same effect of increasing the Qo value of the microstrip line 50 as with the microstrip line 40 in the first preferred embodiment in FIG. 1.

Figure 4:
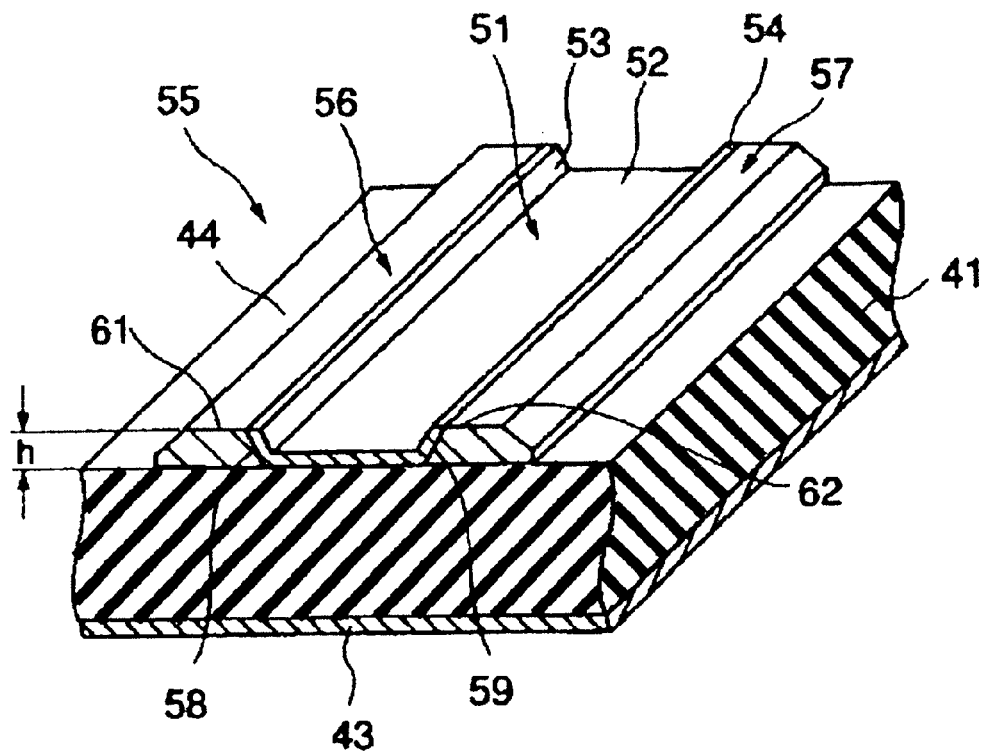
FIG. 4 is a cross sectional oblique view illustrating a third preferred embodiment of the microstrip line according to the present invention.

FIG. 4 illustrates a third preferred embodiment of the microstrip line according to the present invention. Those components that are the same as in the second preferred embodiment are numbered the same, and redundant descriptions of common portions are omitted. The characteristic feature of this preferred embodiment is that reinforcing components are provided to support the strip conductor.

In FIG. 4, a microstrip line 55 includes reinforcing components 56 and 57 that support the edge electrodes 53 and 54 from the outside along the entire length of the edge electrodes 53 and 54, and that are provided on the front 44 of the dielectric substrate 41. Inclined surfaces 58 and 59 of the reinforcing components 56 and 57 that are in contact with the outer surfaces of the edge electrodes 53 and 54 are inclined at substantially the same angle as the inclination of the edge electrodes 53 and 54. The height of the reinforcing components 56 and 57, that is, the thickness of the reinforcing components 56 and 57 shown between the front 44 of the dielectric substrate 41 and the tops 61 and 62 of the reinforcing components 56 and 57, is substantially the same height h defined by the projected height of the edge electrodes 53 and 54. The width of the reinforcing components 56 and 57 is determined according to the length t of the edge electrodes 53 and 54.

With the microstrip line 50 according to the second preferred embodiment, as the length t of the edge electrodes 53 and 54 that make up the strip conductor 51 increases, it becomes more difficult to produce the strip conductor 51, the structural strength of the strip conductor 51 reduces.

Accordingly, with the microstrip line 55 shown in FIG. 4, the reinforcing components 56 and 57 are formed from insulating films provided on both sides of the strip conductor 51. Specifically, the reinforcing components 56 and 57 have a specific width and in the same height as the projected height of the edge electrodes 53 and 54, are in contact with the outer surfaces of the edge electrodes 53 and 54, and support the edge electrodes 53 and 54 from the outside of the strip conductor 51. The sides of the reinforcing components 56 and 57 in contact with the outer surfaces of the edge electrodes 53 and 54 are the flat, inclined faces 58 and 59.

The insulating films that define the reinforcing components 56 and 57 can be, for example, a resin material with a small dielectric loss tangent and a low dielectric constant, such as BCB (benzocyclobutene) or polyimide resin, or a ceramic material with a low dielectric constant. BCB having a low dielectric constant of about 2.3, and a ceramic material with a dielectric constant of about 7.3 and a dielectric loss tangent of about 0.0001 to 0.001 can be used.

As mentioned above, providing the reinforcing components 56 and 57 to the microstrip line 55 greatly increases the structural strength of the strip conductor 51. Also, since a material with a low dielectric constant and a small dielectric loss tangent is used for the insulating films defining the reinforcing components 56 and 57, the increase in transmission loss along the microstrip line 55 due to the reinforcing components 56 and 57 provided on both sides of the strip conductor 51 is minimized.

Figure 23:
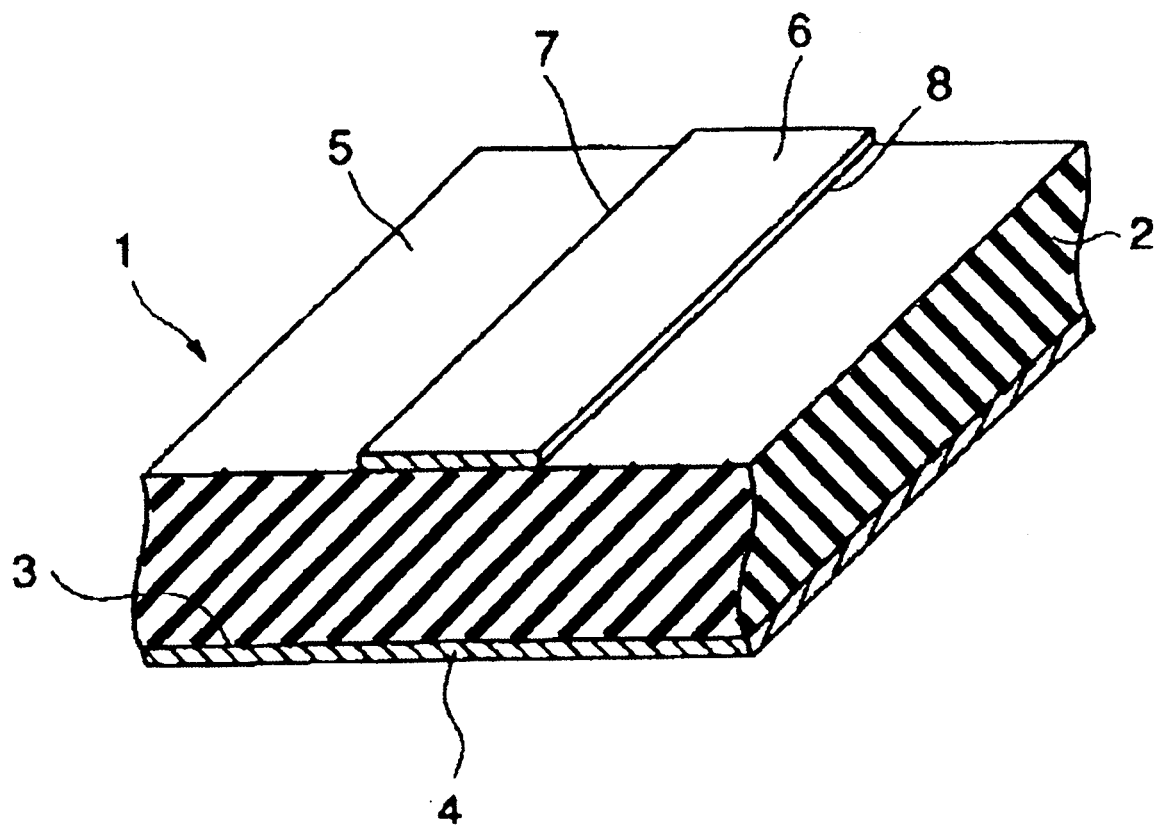
FIG. 23 is a cross sectional oblique view of a conventional microstrip line.

Therefore, even when the reinforcing components 56 and 57 are provided on the microstrip line 55, the reduction of the transmission loss of the microstrip line 55 achieved by providing the edge electrodes 53 and 54 is far superior as compared with the transmission loss of the conventional microstrip line 1 shown in FIG. 23, to which the edge electrodes 53 and 54 are not provided.

Additionally, in the manufacture of the microstrip line 55, providing the reinforcing components 56 and 57 facilitates the formation of the strip conductor 51, and particularly the formation of the edge electrodes 53 and 54, and further, prevents damage to the edge electrodes 53 and 54, such that the manufacturing yield of the microstrip line 55 is greatly increased and the manufacturing costs are greatly reduced.

With the above-described structure, when fine working involving a narrower strip conductor 51 is required to produce the microstrip lines 55 at a higher density, BCB or a polyimide resin, which affords good working precision, is used for the insulating films that define the reinforcing components 56 and 57.

Figure 5A:
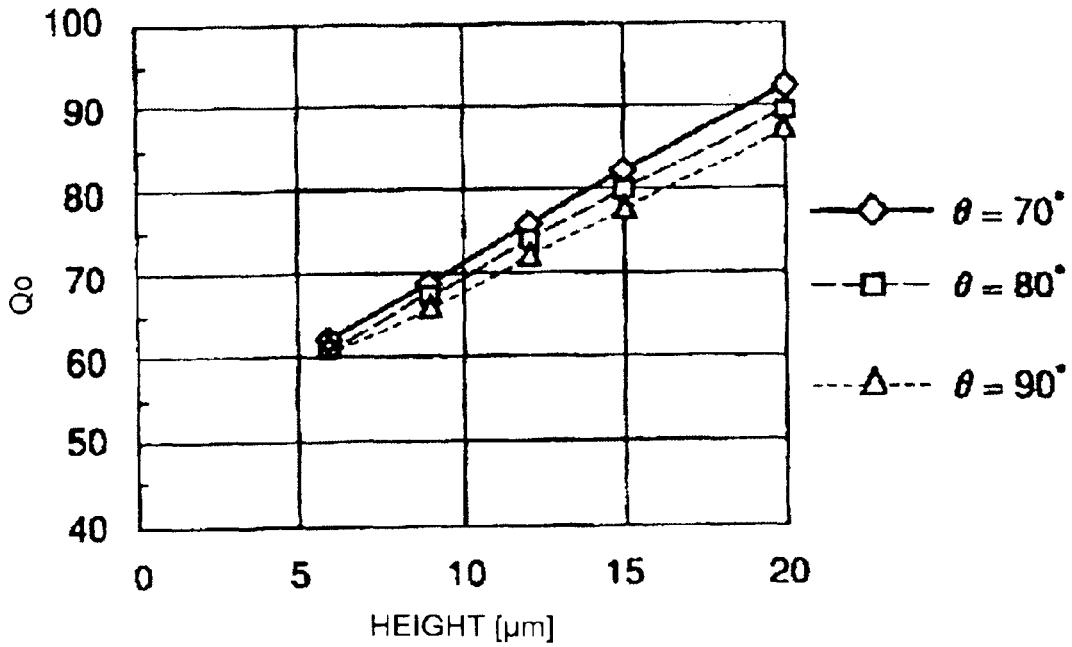
FIGS. 5A and 5B shows the transmission characteristics of the microstrip line in FIG. 4, with FIG. 5A being a graph of the Qo value versus the vertical height of the edge electrodes, and FIG. 5B a graph of the characteristic impedance and effective dielectric constant versus the vertical height of the edge electrodes.
Figure 5B:
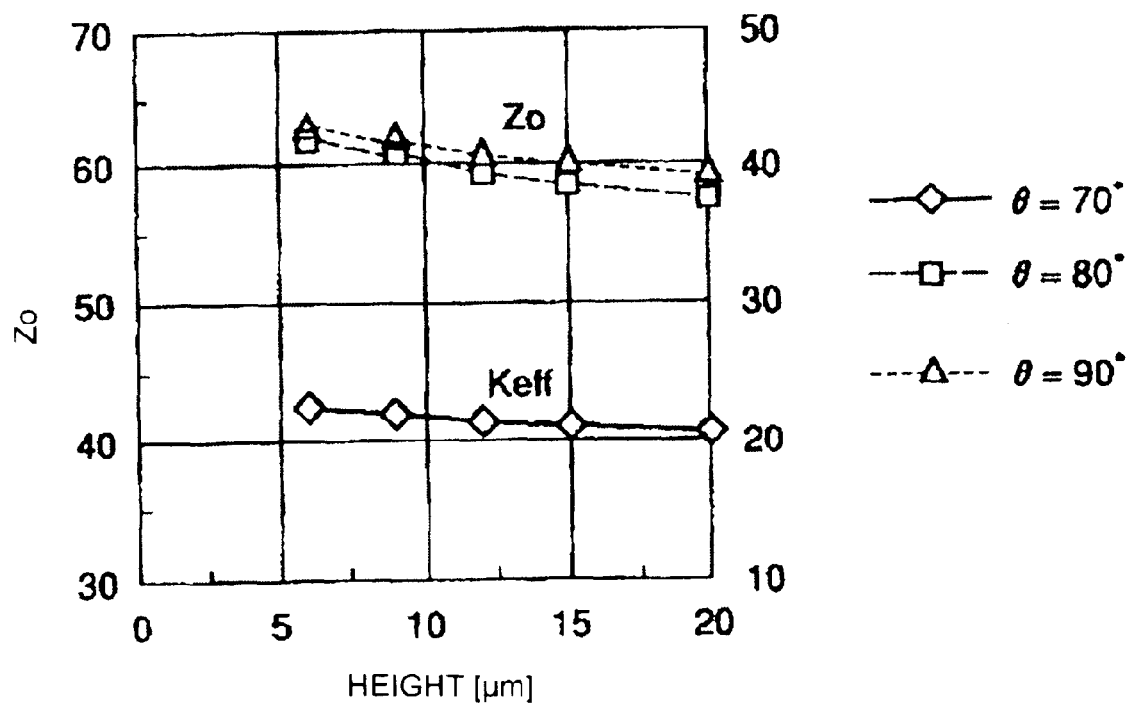

FIG. 5A and 5B shows the transmission characteristics of the microstrip line 55 when the reinforcing components 56 and 57 are provided. These transmission characteristics are shown as the calculated values when the edge electrodes 53 and 54 are vertical (θ=90°), and as the calculated values when the edge electrodes 53 and 54 are inclined at 70 degrees (θ=70°) and 80 degrees (θ=80°). In this example, BCB insulating films are preferably used for the reinforcing components 56 and 57 when the angle θ is about 70 degrees and about 80 degrees.

In the graphs of FIGS. 5A and 5B, "height h" refers to the projected height of the inclined edge electrodes 53 and 54. The dielectric substrate 41 preferably has a thickness of about 300 μm and a dielectric constant of about 38, and the line electrode 52 has a thickness of about 5 μm and a width of about 20 μm. The thickness of the edge electrodes 53 and 54 is about 5 μm. The thickness of the reinforcing components 56 and 57 varies with the angle of inclination of the edge electrodes 53 and 54, and is equal to the projected height h of the edge electrodes 53 and 54.

As shown in FIG. 5A, when the projected height h of the edge electrodes 53 and 54 is varied between about 6 μm and about 20 μm, the Qo value of the microstrip line 55 increases along with the length t of the edge electrodes 53 and 54 at any angle θ. Furthermore, as the inclination of the edge electrodes 53 and 54 increases, the Qo value increases. In contrast, as shown in FIG. 5B, there is only a slight change in the characteristic impedance Zo and the effective dielectric constant Keff.

When the microstrip line 55 is configured as described above, with the edge electrodes 53 and 54 inclined and the strip conductor 51 supported by the reinforcing components 56 and 57, the transmission characteristics similar to the transmission characteristics shown in FIGS. 2A and 2B for the microstrip line 40 of the first preferred embodiment, and the conductor loss of the microstrip line 55 is greatly reduced.

Also, when the microstrip line 55 is produced, for example, the line electrode 52 is formed as a thin film on the front 44 of the dielectric substrate 41, and BCB films that define the reinforcing components 56 and 57 are provided with the inclined surfaces 58 and 59, which are inclined toward the edges of the line electrode 52, after which the edge electrodes 53 and 54 are provided using the inclined surfaces 58 and 59 of the reinforcing components 56 and 57, which facilitates the formation of the edge electrodes 53 and 54 and produces greater precision than when the edge electrodes 53 and 54 are disposed vertically.

Figure 6:
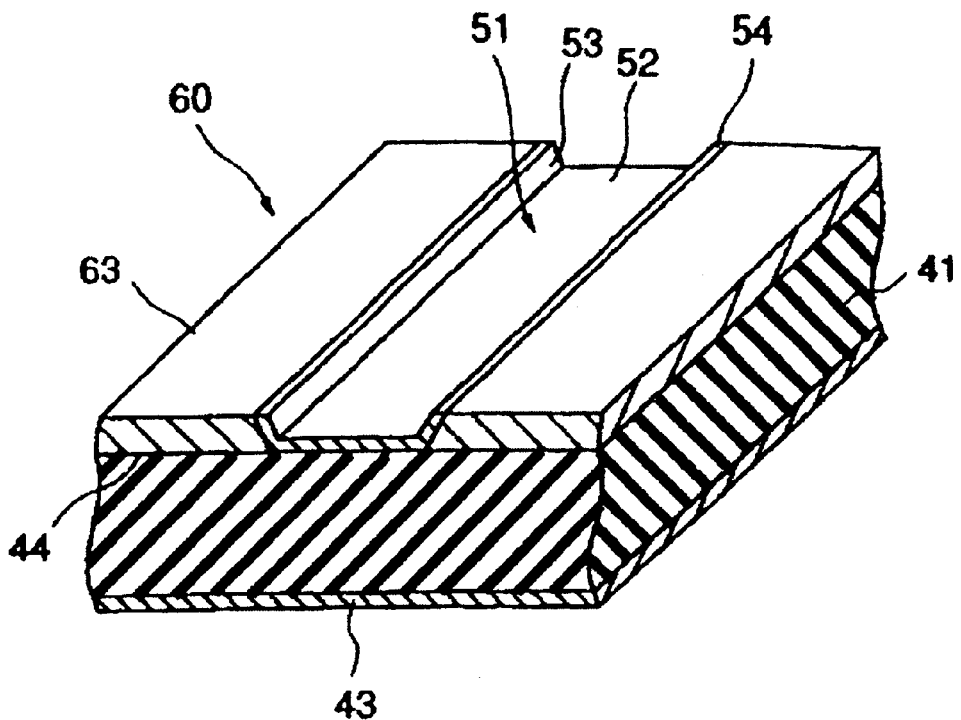
FIG. 6 is a cross sectional oblique view illustrating a fourth preferred embodiment of the microstrip line according to the present invention.

The reinforcing components 56 and 57 are provided along the edge electrodes 53 and 54 with the microstrip line 55 described above, however a reinforcing layer 63 is provided with the microstrip line 60 of the fourth preferred embodiment shown in FIG. 6. This reinforcing layer 63 is defined by an insulating film with a small dielectric loss tangent, provided as a layer over the entire front 44 of the dielectric substrate 41 except for the portion where the strip conductor 51 is provided, and supports the edge electrodes 53 and 54 from the outside, similar to the reinforcing components 56 and 57 shown in FIG. 4. A ground electrode 43 is provided on the back of dielectric substrate 41.

The structural strength of the edge electrodes 53 and 54 is similarly increased by the reinforcing layer 63 in this microstrip line 60. Further, since the reinforcing layer 63 is defined by a material having a low dielectric constant, the effective length of the line electrode 52 is determined by the wavelength shortening effect attributable to the dielectric constant of the dielectric substrate 41. Naturally, electronic components are mounted by providing circuit wiring on the front of the reinforcing layer 63.

Figure 7:
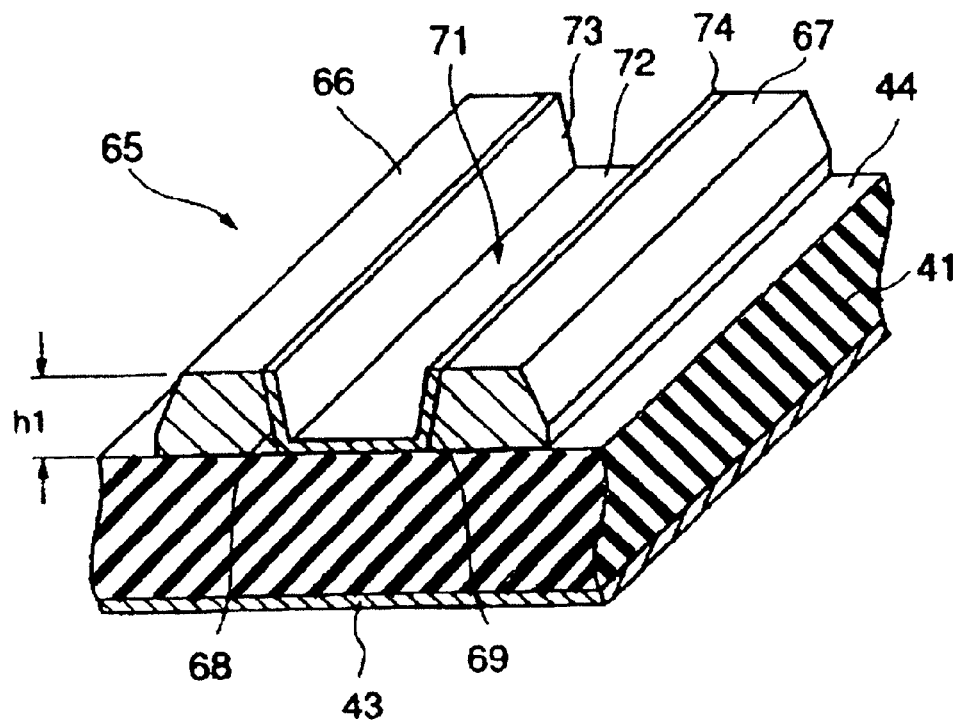
FIG. 7 is a cross sectional oblique view illustrating a variation on the microstrip line in FIG. 4.

The microstrip line 65 in FIG. 7 is a variation on the third preferred embodiment, the characteristic feature being that edge electrodes 73 and 74 are much higher (longer) than the edge electrodes 53 and 54 discussed above and shown in FIG. 4, and reinforcing components 66 and 67 are preferably made of a ceramic material. The dielectric substrate 41 is also preferably made of a ceramic material, and has a thickness of, for example, about 300 μm and a dielectric constant of, for example, about 30. The dielectric constant of the ceramic material that forms the reinforcing components 66 and 67 is preferably about 7.3.

As in the third preferred embodiment, the reinforcing components 66 and 67 are disposed along the edges extending in the lengthwise direction on both sides of a strip conductor 71. At about 150 μm, a line electrode 72 of the strip conductor 71 is wider than in the third preferred embodiment. The edge electrodes 73 and 74 of the strip conductor 71 are provided on the mutually opposed inclined surfaces 68 and 69 of the reinforcing components 66 and 67. The thickness of the reinforcing components 66 and 67, or in other words, the projected height h1 of the edge electrodes 73 and 74 from the dielectric substrate 41, is about 100 to about 200 μm, which is much greater than in the third preferred embodiment.

Thus, if a ceramic material is used for the reinforcing components 66 and 67, the strip conductor 71 can be configured such that in a lateral cross section thereof, the length t of the edge electrodes 73 and 74 away from the front 44 of the dielectric substrate 41 is substantially equal to or greater than the width of the line electrode 72.

Figure 8:
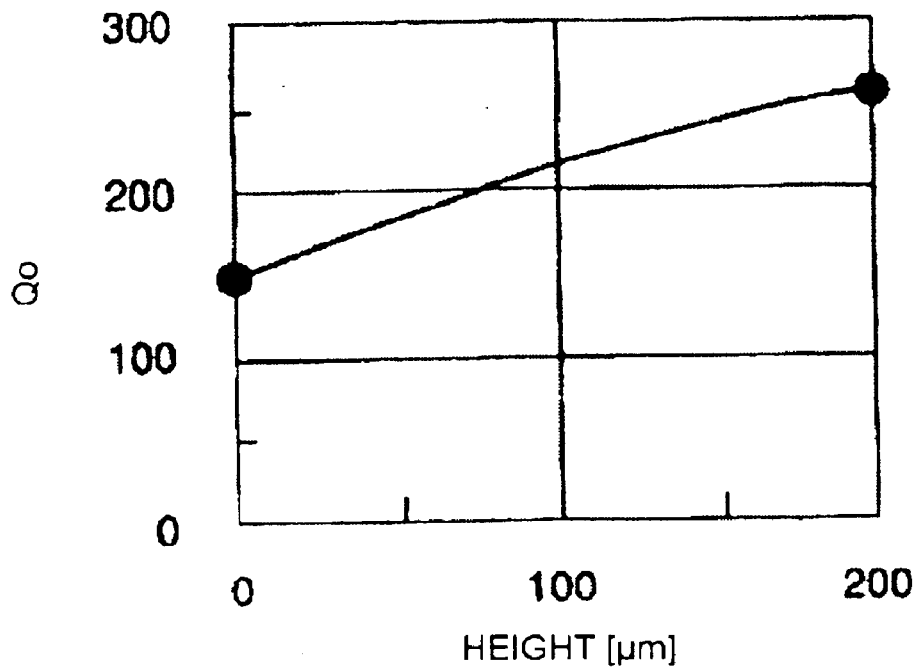
FIG. 8 is a graph of the Qo value versus the vertical height of the edge electrodes in the microstrip line in FIG. 7.

Accordingly, as shown in FIG. 8, the Qo value, that is, the conductor loss, of the microstrip line 65 is greatly improved, and if the projected height h1 of the edge electrodes 73 and 74 is about 200 μm, for instance, the Qo value of the microstrip line 65 is improved to 1.7 times that when the edge electrodes 73 and 74 are not provided.

The method for producing the microstrip line 65 will be briefly described with reference to FIG. 9. A ground electrode 43 is provided on the back of dielectric substrate 41. The pair of reinforcing components 66 and 67, having the inclined surfaces 68 and 69, is arranged substantially parallel at the location where the strip conductor 71 is to be formed on the front 44 of the dielectric substrate 41. The reinforcing components 66 and 67 are placed a specific distance apart and with the inclined surfaces 68 and 69 facing each other. The projected height h1 of the edge electrodes 73 and 74 is determined by the thickness of the reinforcing components 66 and 67.

When this production method is used, a line groove 70 having a depth of from a few dozen to a few hundred microns is formed on the front 44 of the dielectric substrate 41, with the inclined surfaces 68 and 69 between the reinforcing component 66 and the reinforcing component 67 serving as the groove walls, and the front 44 of the dielectric substrate 41 serving as the groove bottom. Put another way, if the reinforcing components 66 and 67 are preferably made of a ceramic material, the projected height h1 of the edge electrodes 73 and 74 can be set as desired outside the range of about 100 μm to about 200 μm, that is, much less than about 100 μm or much greater than about 200 μm. The strip conductor 71 is formed by providing a thin film of a conductor material in this line groove 70 by vapor deposition, sputtering, electroless plating, or other suitable method. Specifically, the line electrode 72 is provided on the front 44 of the dielectric substrate 41, and the edge electrodes 73 and 74 are provided on the inclined surfaces 68 and 69.

Figure 10:
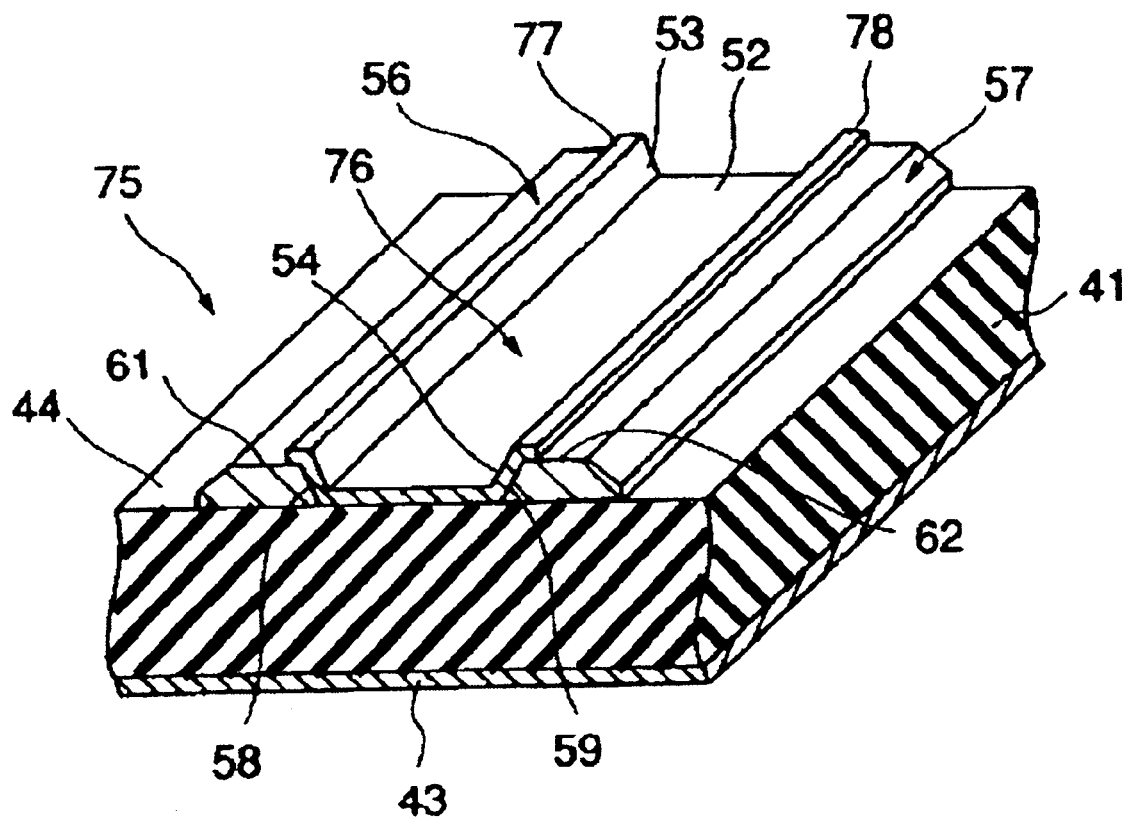
FIG. 10 is a cross sectional oblique view illustrating a fifth preferred embodiment of the microstrip line according to the present invention.
Figure 11:
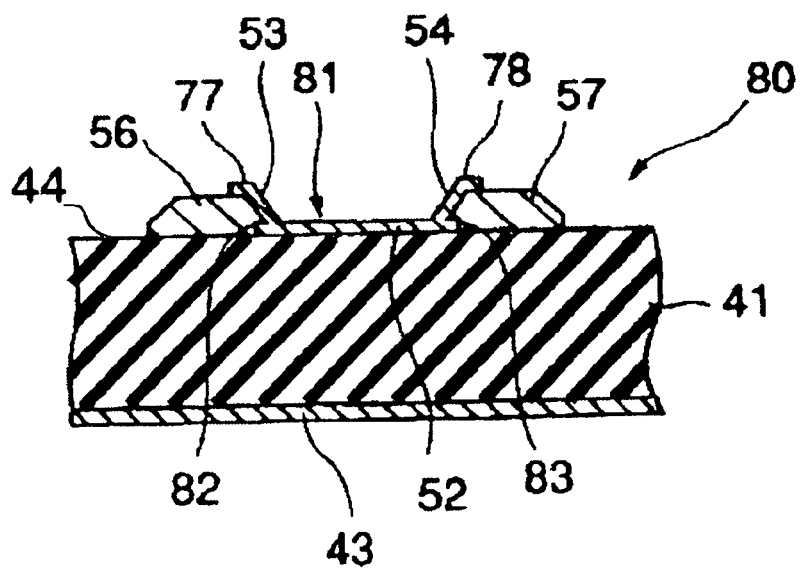
FIG. 11 is a cross sectional oblique view illustrating a sixth preferred embodiment of the microstrip line according to the present invention.

FIGS. 10 and 11 illustrate fifth and sixth preferred embodiments of the microstrip line according to the present invention. Those components that are the same as in the third preferred embodiment shown in FIG. 4 are numbered the same, and redundant descriptions of common portions are omitted. The characteristic feature of these preferred embodiments is that the edge electrodes have a flat portion.

With the microstrip line 75 shown in FIG. 10, a strip conductor 76 includes the line electrode 52 and the edge electrodes 53 and 54 arranged at an angle at the edges on both sides of this line electrode 52. The characteristic feature of the fifth preferred embodiment is that flat portions 77 and 78 are provided at the tops of the edge electrodes 53 and 54. These flat portions 77 and 78 are provided on the upper surfaces of the reinforcing components 56 and 57 over the entire length of the edge electrodes 53 and 54, extending substantially parallel to the front 44 of the dielectric substrate 41 from the tops of the edge electrodes 53 and 54 toward the reinforcing components 56 and 57. This enables the inclined portions of the edge electrodes 53 and 54 to be produced with outstanding dimensional precision.

Also, when the edge electrodes 53 and 54 are provided, a strip conductor 81 is configured such that the location where the edge electrodes 53 and 54 are provided is slightly to the inside of edges 82 and 83 on both sides of the line electrode 52, as is the case with the microstrip line 80 shown in FIG. 11. With this configuration, a portion of the line electrode 52 is between the insulating films that define the reinforcing components 56 and 57 and the front 44 of the dielectric substrate 41.

This configuration of the microstrip line 80 requires outstanding dimensional precision of the width of the line electrode 52, and thus, the line electrode 52 is provided on the front 44 of the dielectric substrate 41 at the beginning of the manufacturing process. Then, the reinforcing components 56 and 57 are preferably formed from insulating films of BCB resin on both sides of the line electrode 52, after which the inclined surfaces of the reinforcing components 56 and 57 are utilized in forming the edge electrodes 53 and 54. This method greatly improves the dimensional precision of both the line electrode 52 and the edge electrodes 53 and 54.

Figure 12:
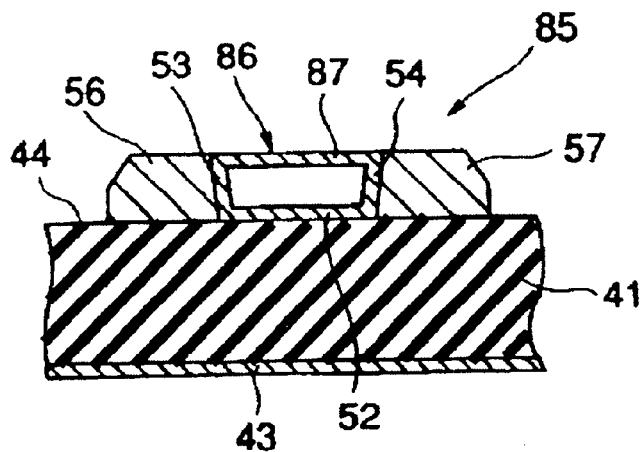
FIG. 12 is a cross sectional oblique view illustrating a seventh preferred embodiment of the microstrip line according to the present invention.
Figure 13:
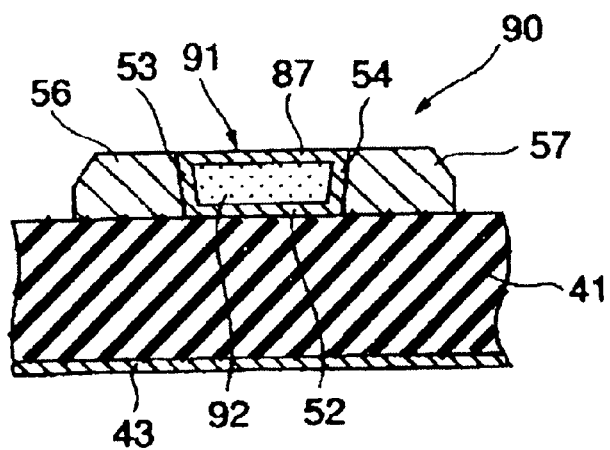
FIG. 13 is a cross sectional oblique view illustrating an eighth preferred embodiment of the microstrip line according to the present invention.

FIGS. 12 and 13 illustrate seventh and eighth preferred embodiments of the microstrip line according to the present invention. Those components that are the same as in the third preferred embodiment shown in FIG. 4 are numbered the same, and redundant descriptions of common portions are omitted. The characteristic feature of these preferred embodiments is a flat electrode provided above the line electrode.

With the microstrip line 85 shown in FIG. 12, the strip conductor 86 includes the line electrode 52 provided on the front 44 of the dielectric substrate 41, the edge electrodes 53 and 54 that are linked at an angle to the edges of this line electrode 52, and the flat electrode 87 provided at the upper end of the edge electrode 53 and the upper end of the edge electrode 54, linking the edge electrodes 53 and 54 over their entire length, and substantially parallel to the line electrode 52. The inside area surrounded by the line electrode 52, the edge electrodes 53 and 54, and the flat electrode 87 is empty space.

With the configuration of the microstrip line 90 shown in FIG. 13, the internal space in a strip conductor 91 surrounded by the line electrode 52, the edge electrodes 53 and 54, and the flat electrode 87 is filled with a filler 92 having a small dielectric loss tangent, such as the BCB resin or other resin material that defines the reinforcing components 56 and 57, a ceramic material, or another suitable insulating substance. The effect of this configuration is that the flat electrode 87 can be formed after the line electrode 52 and the edge electrodes 53 and 54 have been formed and filled with the filler, which facilitates production of the strip conductor 91.

Figure 14:
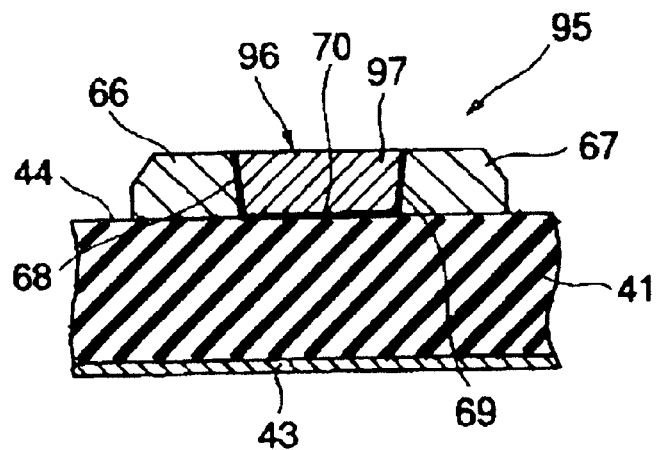
FIG. 14 is a cross sectional oblique view illustrating a ninth preferred embodiment of the microstrip line according to the present invention.

FIG. 14 illustrates the ninth preferred embodiment of the microstrip line according to the present invention. Those components that are the same as in the preferred embodiment illustrated in FIG. 9 are numbered the same, and redundant descriptions of common portions are omitted. The characteristic feature of this preferred embodiment is that, unlike in the preferred embodiments described above, the line electrode of the microstrip line is much thicker.

Figure 9:
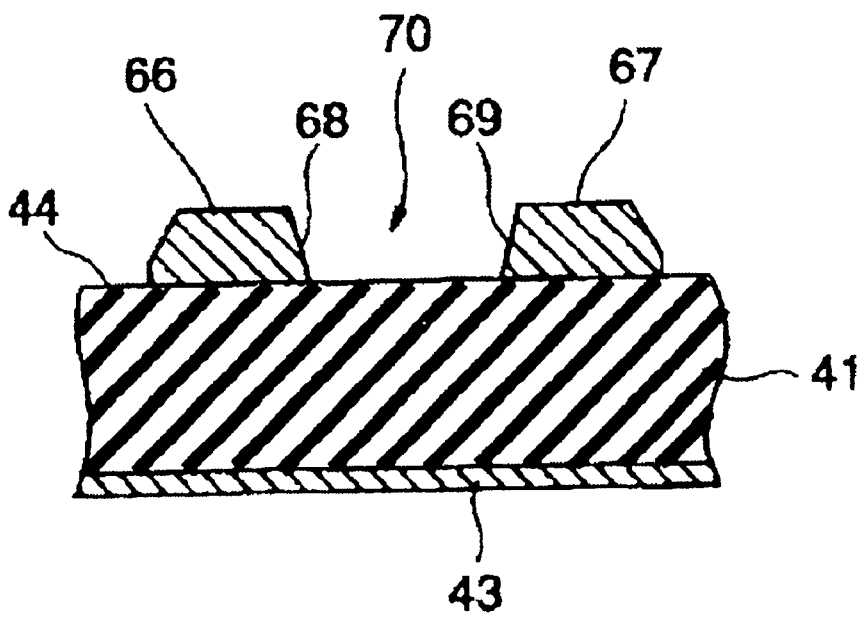
FIG. 9 is a cross section of a portion of FIG. 7.

A strip conductor 96 of a microstrip line 95 is provided using the line groove 70 shown in FIG. 9. Specifically, a line electrode 97 that defines the strip conductor 96 is provided having an increased thickness by filling in the line groove 70 with a conductive material. The thickness of the line electrode 97 is greater than the thickness of the line electrodes 46, 52, and 72 in the preferred embodiments described above. Edge electrodes are therefore unnecessary. The thickness of the line electrode 97 is determined by the thickness of the pair of reinforcing components 66 and 67.

The effect of this configuration is that the edge portions of the line electrode 97, that is, the sides of the line electrode 97, have a greater surface area and high frequency current is more evenly dispersed, such that there is less conductor loss in the line electrode 97, and the transmission loss along the microstrip line 95 is greatly reduced.

Figure 15:
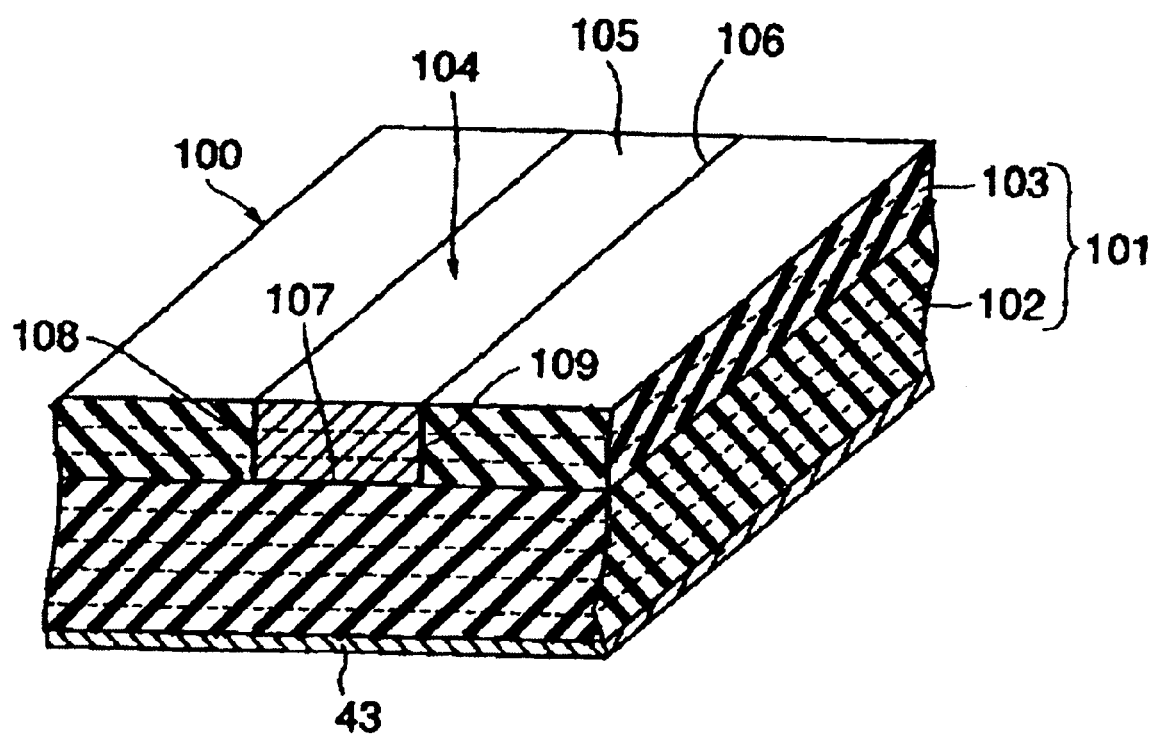
FIG. 15 is a cross sectional oblique view illustrating a tenth preferred embodiment of the microstrip line according to the present invention.

FIG. 15 illustrates a tenth preferred embodiment of the microstrip line pertaining to the present invention. The characteristic feature of this preferred embodiment is that the microstrip line includes a laminated substrate.

A microstrip line 100 includes a strip conductor 104 provided on a laminated substrate 101 including a first lamination component 102 and a second lamination component 103. The first lamination component 102 defines the dielectric substrate, and is made, for example, by laminating a plurality of dielectric sheets (green sheets) such that the thickness after baking will be about 60 $\mu$m. These dielectric sheets are formed, for example, from a ceramic material with a high dielectric constant (such as a dielectric constant of about 30). More specifically, the first lamination component 102 is produced by laminating five dielectric sheets such that the substrate thickness after baking is about 300 $\mu$m. The ground electrode 43 is provided on the back of the first lamination component 102. The bottom 107 of the line electrode 105 is provided in contact with the first lamination component 102, and the side surfaces 108 and 109 are provided in contact with the second lamination component 103.

The second lamination component 103 is a reinforcing layer, and is formed, for example, by laminating one or more dielectric sheets (green sheets) composed of a dielectric material over the front of the first lamination component 102 such that the thickness of the sheets after baking is about 60 $\mu$m. The dielectric sheets of the second lamination component 103 are ceramic sheets having a low dielectric constant of about 7.3, for example. A line formation hole 106, such as a slot, is provided in the dielectric sheets such that the width and length will match the designed shape of the strip conductor 104 after shrinkage caused by baking. This line formation hole 106 is filled with a conductive material, and this conductive portion defines a line electrode 105.

Again with the above configuration, when the thickness of the line electrode 105 is increased, the Qo value of the microstrip line 100 increases, just as with the characteristics of the Qo value shown in FIG. 8. When the thickness of the line electrode 105 of the second lamination component 103 is increased, a plurality of dielectric sheets are laminated. In this case, the lamination is performed such that the conductive portion filling the line formation hole 106 is aligned with outstanding precision in the upper and lower dielectric sheets, or in other words, such that the portions of the dielectric sheets including the line formation hole 106 will line up in the upper and lower layers. Therefore, filling the line formation hole 106 with a conductive material and laminating dielectric sheets enables the thickness of the line electrode 105 to be varied as desired, and furthermore produces a line electrode 105 having outstanding dimensional precision. Put another way, it is easy to produce a strip conductor 104 in which the cross section of the line electrode 105 has a high aspect ratio.

Figure 16A:
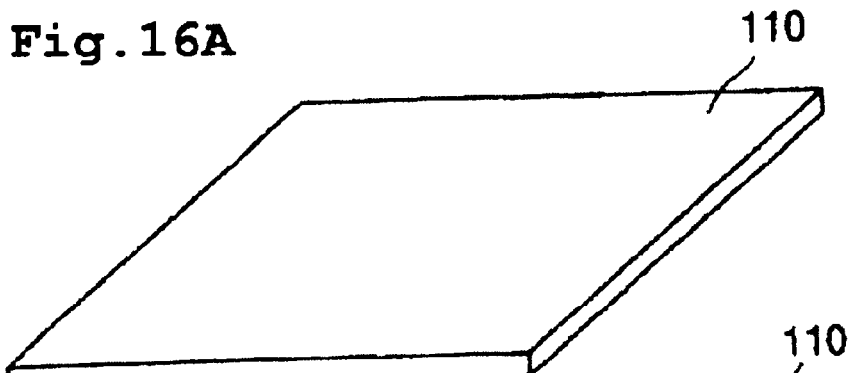
FIGS. 16A, 16B, 16C and 16D are diagrams of the method for producing the microstrip line in FIG. 15, with FIG. 16A and FIG. 16B being oblique views of dielectric sheets, FIG. 16C a detail cross sectional oblique view of the dielectric sheet, and FIG. 16D a detail cross sectional oblique view of the laminated unit.

The method for manufacturing the microstrip line 100, and particularly the method for producing the second lamination component 103 portion, will now be described with reference to FIGS. 16A, 16B, 16C and 16D. First, the dielectric sheet (green sheet) 110 shown in FIG. 16A is produced. Suitable amounts of binder, plasticizer, and solvent are added to a ceramic or glass ceramic powder, and these are kneaded to produce a slurry. The inorganic material used as the binder is preferably a low-loss material with a low baking temperature, whose main components are a material based on BaO—TiO₂-rare earth oxide, and borosilicate glass, such as Mg—Al—Sl—B—O. The slurry obtained in this manner is applied by doctor blade to form the dielectric sheet 110 having the desired thickness.

We will assume here that the shrinkage of the dielectric sheet 110 in the primary dimension during baking is about 20%. The shrinkage of a dielectric sheet during baking varies with the conditions under which the dielectric sheet is produced, the baking conditions, and so forth, so the shrinkage is not limited to about 20%, and should be set as dictated by the production conditions.

Figure 16B:
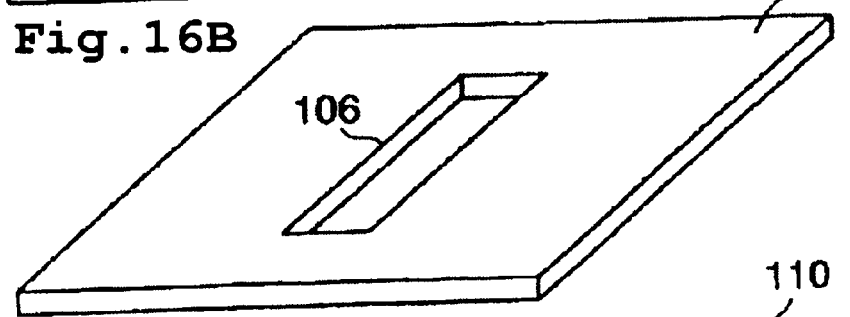

As shown in FIG. 16B the line formation hole 106 having a width of about 250 μm is formed with an NC puncher in and completely through this dielectric sheet 110. The length of the line formation hole 106 is the length required for design purposes. In addition to punching with an NC puncher, laser punching, mold tool punching, mechanical cutting, or another suitable method can be used to form the line formation hole 106.

Figure 16C:
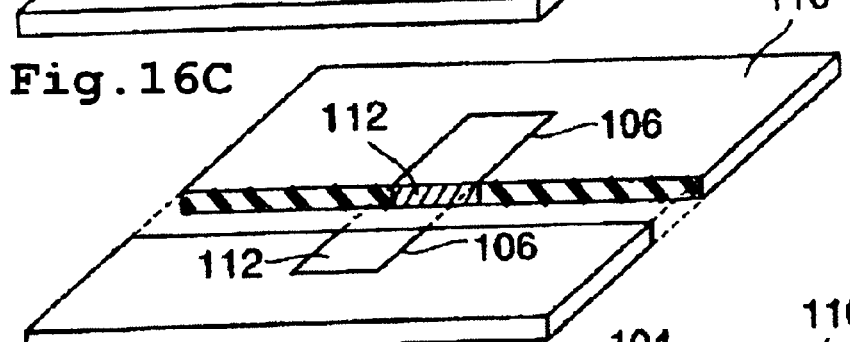

The line formation hole 106 in the dielectric sheet 110 is filled with a silver-based conductive paste (the conductive material) as shown in FIG. 16C. This filling forms a conductive component 112 of the same thickness as the dielectric sheet 110 in the line formation hole 106 portion. The conductive paste is not limited to a silver-based material, and can also be any other low-resistance metal material based on gold, copper, or other suitable material. After this, the dielectric sheet 110 in which the conductive component 112 has been formed is dried for about 15 minutes at about 60° C.

Figure 16D:
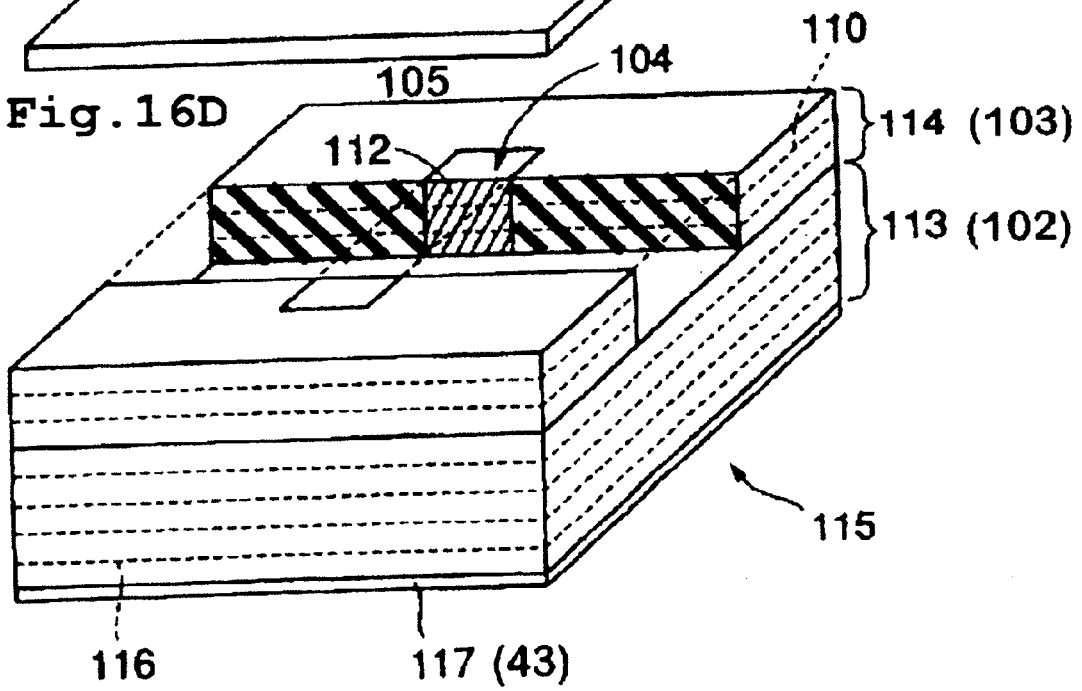

These dried dielectric sheets 110 are used to produce a laminated unit 115 in which reinforcing laminates 114 that define the second lamination component 103 are provided over a substrate laminate 113 that define the first lamination component 102, as shown in FIG. 16D. When the thickness of the line electrode 105 is the same (about 180 μm) as the thickness of the strip conductor 104, for instance, three 75 μm dielectric sheets 110 in which the conductive component 112 has been formed are laminated by press bonding over the substrate laminate 113. At this stage of the process, the substrate laminate 113 is in a state in which dielectric sheets 116 made of dried ceramic material have been press bonded and laminated, and a conductor layer 117 defining the ground electrode 43 is applied to the lowermost dielectric sheet 116 by screen printing using a silver-based conductive paste.

The laminated unit 115 configured as above is baked for about 1 hour at a temperature of about 900° C. to obtain a laminated ceramic sinter. This baking sinters and integrates the various layers of conductive component 112 in the reinforcing laminate 114, and completes the microstrip line 100 equipped with the reinforcing laminate 114. The line electrode 105 of the strip conductor 104 has a substantially rectangular cross section with a width of about 200 μm and a thickness of about 180 μm, the bottom 107 of the line electrode 105 is in contact with the first lamination component 102 over a width of about 200 μm, and the side surfaces 108 and 109 are in contact with the second lamination component 103, which is about 180 μm thick.

With the above method for producing a microstrip line, the thickness of the line electrode 105 can be increased as desired in about 60 μm increments by laminating more dielectric sheets 110 in which the conductive component 112 has been formed, and this increases the surface area of the side surfaces 108 and 109 of the line electrode 105, and reduces the transmission loss along the microstrip line 100. Also, since the line electrode 105 is made using the line formation holes 106 provided in the dielectric sheets 110, the dimensional precision is outstanding, and the line formation holes 106 are formed by NC punching or another simple method, which greatly reduces the manufacturing costs.

The manufacturing method discussed above only involves the production of a microstrip line, but internal wiring or internal electrodes can also be provided, as needed, between the layers of the laminated unit 115, and via-hole conductors can be formed to link the internal wiring or internal electrodes to form an inductor or a capacitor. In this case, the via-holes are made in the dielectric sheets 110 at the same time the line formation holes 106 are formed, and the via-hole conductors are formed by filling the via-holes with a conductive paste at the same time the conductive component 112 is formed. This method provides outstanding design freedom of circuit substrates that feature microstrip lines.

Also, if the line electrode 105 is to be thinner than the above-mentioned dielectric sheet 110, the thickness of the dielectric sheet 110 is reduced. For instance, the baked line electrode 105 can be formed in units of about 40 μm of thickness by changing the thickness of the dielectric sheets 110 to about 50 μm. The second lamination component 103 may also be formed by laminating one or more layers of organic insulating film using BCB, a polyimide resin, or other suitable material. The manufacturing method described above is not used when an organic insulating film is used. A pre-baked first lamination component 102 is used instead.

Figure 17:
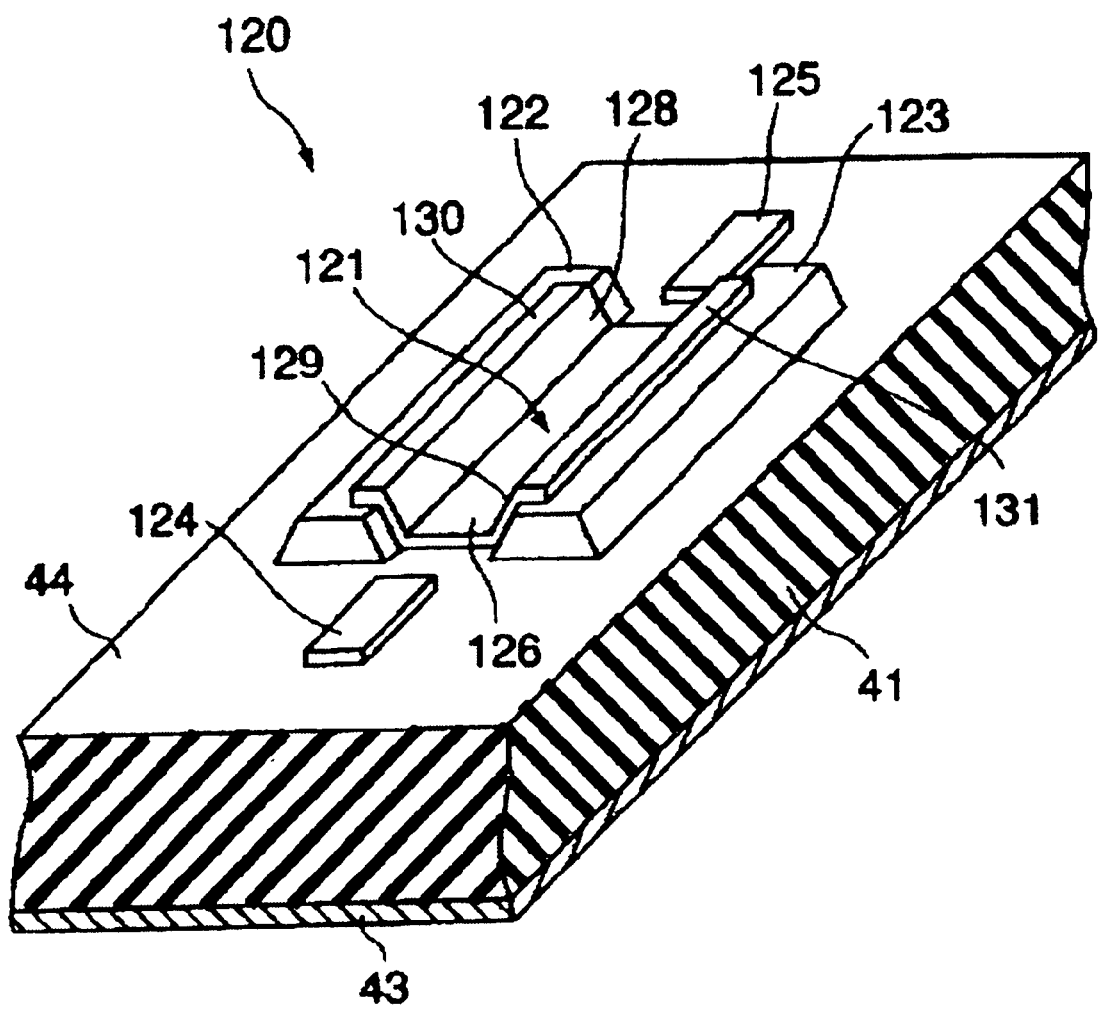
FIG. 17 is a detail cross sectional oblique view illustrating a preferred embodiment of the resonator device according to the present invention.

FIG. 17 illustrates a preferred embodiment of the resonator device according to the present invention. Those components that are the same as in the fifth preferred embodiment shown in FIG. 10 are numbered the same, and redundant descriptions of common portions are omitted.

As shown in FIG. 17, a resonator device 120 includes the microstrip line 75 shown in FIG. 10. The resonator device 120 is provided on the front 44 of the dielectric substrate 41, and includes a strip conductor 121 having a length of approximately one-half the wavelength of the resonance frequency fo that will be used, electrode supports 122 and 123 are disposed on both sides (laterally) of this strip conductor 121, have a trapezoidal cross sectional shape, and are slightly longer than the overall length of the strip conductor 121, and link electrodes 124 and 125 provided to the front 44 in proximity to the ends of the strip conductor 121 in its lengthwise direction.

With the above configuration, the strip conductor 121 includes a resonance electrode 126 provided on the front 44 of the dielectric substrate 41, and edge electrodes 128 and 129 provided on both sides in the lateral direction of this resonance electrode 126. The length of the resonance electrode 126 is approximately one-half the wavelength of the resonance frequency fo. Further, the edge electrodes 128 and 129 are provided along the entire length of the resonance electrode 126 (the edges extending in the lengthwise direction), supported by the inclined faces of the electrode supports 122 and 123. Flat portions 130 and 131 extending to the upper surfaces of the electrode supports 122 and 123 are provided to the tops of the edge electrodes 128 and 129.

The above configuration produces a resonator device 120 having a high Qo value during resonance. This Qo value is determined from the following equation.

Q=2πfox(stored energy of resonance circuit)/(energy lost in resonance circuit in 1 second)

Here, fo is the resonance frequency of the resonator device 120, and the resonance circuit is the equivalent resonance circuit corresponding to the resonator device 120.

It can be seen from this equation that the Qo value of the resonance circuit increases in inverse proportion to the energy loss in the resonance circuit. Specifically, the resonator device 120 includes the edge electrodes 128 and 129 provided to the resonance electrode 126, which lessens the concentration of current at the edges of the resonance electrode 126, decreases the conductor loss of the resonance electrode 126, and reduces the energy loss of the resonance circuit. Also, much less variance in the Qo value occurs during the manufacture of the resonator device 120 as described above, such that the manufacturing yield is greatly increased, and, as a result, the manufacturing costs are greatly reduced.

The resonator device 120 described above features the microstrip line 75 shown in FIG. 10, however, the resonator device can be constructed using the microstrip lines according to any of the other preferred embodiments.

Figure 18:
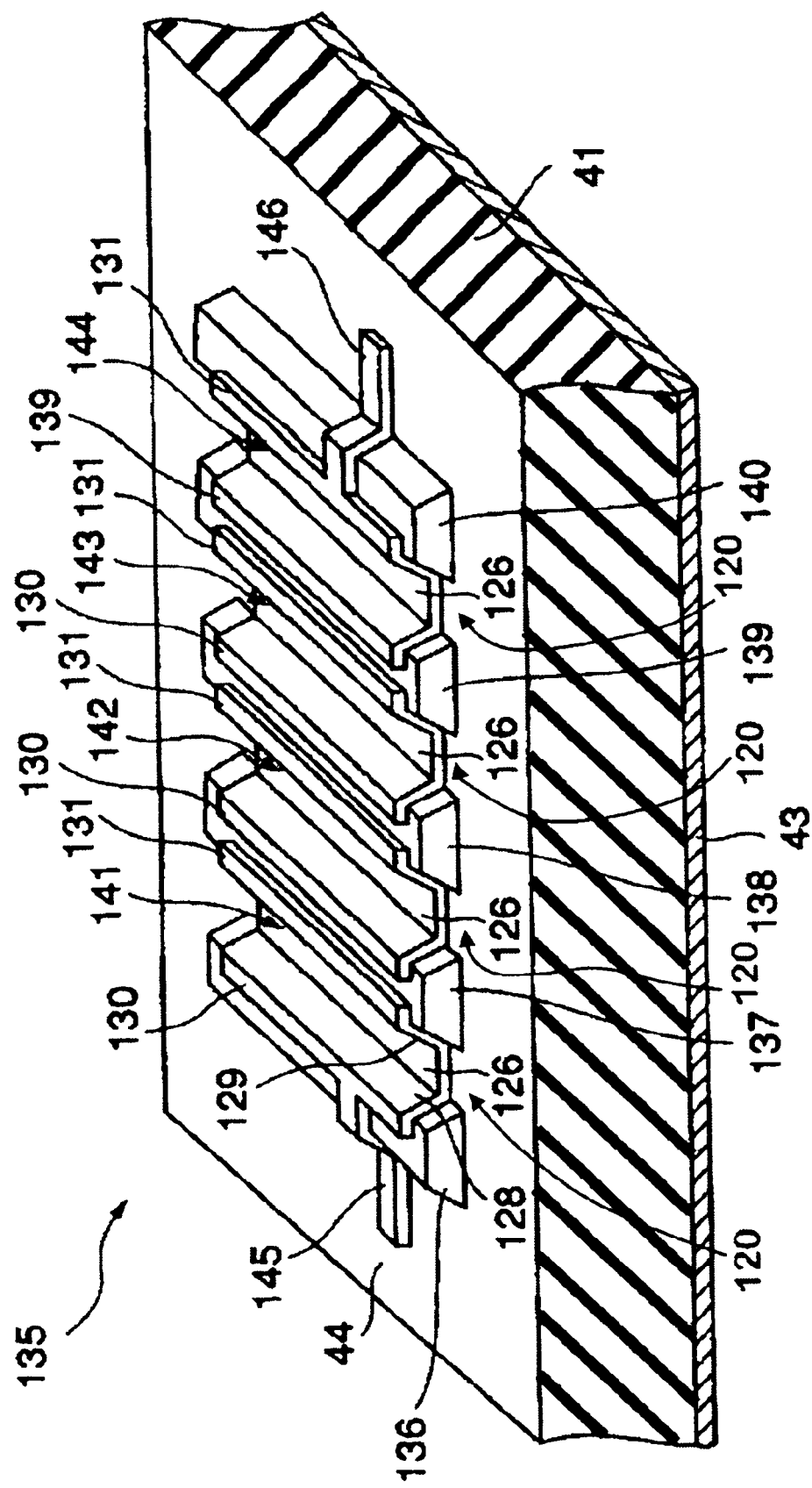
FIG. 18 is a detail cross sectional oblique view illustrating a preferred embodiment of the filter according to the present invention.

FIG. 18 illustrates a preferred embodiment of the filter according to the present invention. Those components that are the same as in the preferred embodiment shown in FIG. 17 are numbered the same, and redundant descriptions of common portions are omitted. The characteristic feature of this preferred embodiment is that four resonator devices are provided.

As shown in FIG. 18, a filter 135 is provided with four resonator devices 120 that are configured as shown in FIG. 17, and includes five electrode supports 136, 137, 138, 139, 140 disposed substantially parallel to each other and equidistantly spaced on the front 44 of the dielectric substrate 41, four strip conductors 141, 142, 143, 144 arranged in a lateral row and provided between the adjacent electrode supports 136, 137, 138, 139, 140, and linking electrodes 145 and 146 that extend in the arrangement direction on the electrode supports 136 and 140 and connect to a flat component 130 of the strip conductor 141 located at the beginning of the lateral row, and to a flat component 131 of the strip conductor 144 located at the end of this row.

The lateral row of strip conductors 141 to 144 share the electrode supports 137, 138, and 139. For instance, the edge electrodes 128 and 129 of the adjacent strip conductors 142 and 143 are provided on inclined surfaces disposed at substantially the same inclination angle as the shared electrode support 138, and the flat components 130 and 131 of the strip conductors 142 and 143 are provided on the upper surface of the shared electrode support 138.

The various strip conductors 141 to 144 have a length of approximately one-half the wavelength at the frequency fo being used. The flat components 130 and 131 of the strip conductors 141 to 144 are disposed in proximity and regularly spaced on the upper surface of the electrode supports, 137,138, and 139.

With the above configuration, if the coupling electrode 145 is used as the input side and the coupling electrode 146 as the output side, for example, when high-frequency current with a frequency of fo is input to the coupling electrode 145, the adjacent strip conductors 141 to 144 are magnetically coupled together, and the various strip conductors 141 to 144 resonate in a coupled mode.

As a result, the filter 135 functions as a bandpass filter that transmits high-frequency signals through a frequency band centered around the frequency fo. This filter 135 produces better filter performance because of the high resonance Q value in the four strip conductors 141 to 144, and the filter loss is also greatly reduced.

Figure 19:
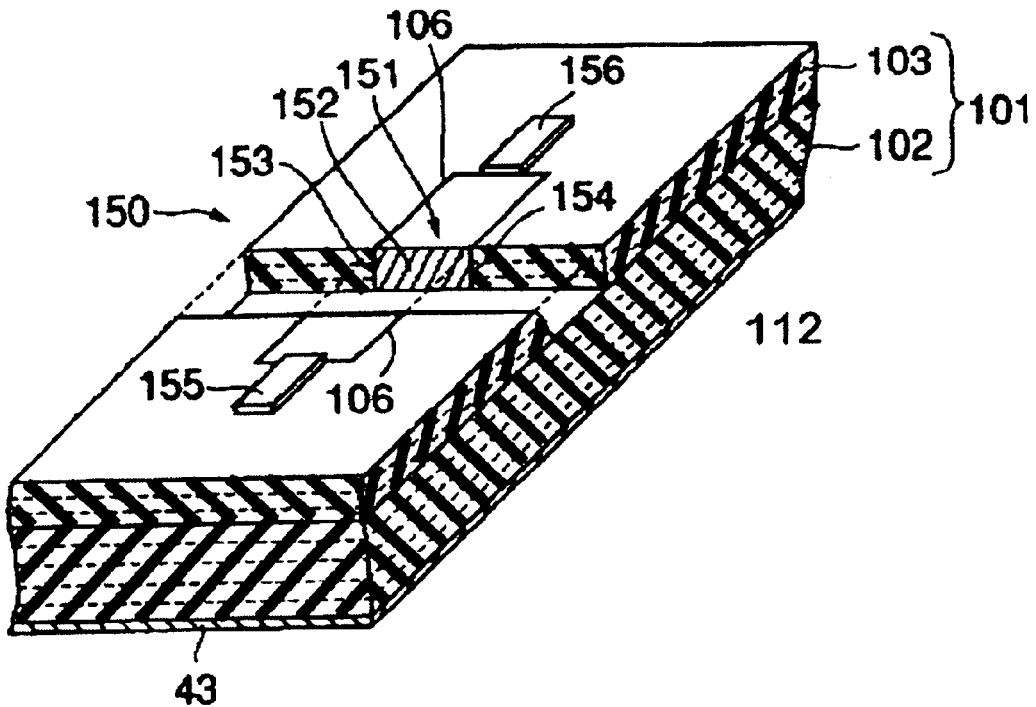
FIG. 19 is a detail cross sectional oblique view illustrating another preferred embodiment of the resonator device according to the present invention.

FIG. 19 illustrates another preferred embodiment of the resonator device according to the present invention. Those components that are the same as in the tenth preferred embodiment shown in FIG. 15 are numbered the same, and redundant descriptions of common portions are omitted. The characteristic feature of the resonator device 150 in this preferred embodiment is the laminated substrate.

In FIG. 19, the resonator device 150 includes the microstrip line 100 shown in FIG. 15. A strip conductor 151 of the resonator device 150 is formed using the production method shown in FIG. 16, and using the conductive component 112 filling the slender line formation hole 106 provided in the second lamination component 103 of the laminated substrate 101. This strip conductor 151 defines a resonance electrode 152 of the resonator device 150.

The thickness of the resonance electrode 152 is determined by the number of layers of the conductive component 112, and coupling electrodes 155 and 156 are provided on both sides in the lengthwise direction of the strip conductor 151, on the front of the second lamination component 103 of the laminated substrate 101, and in contact with the edges of the line formation hole 106.

This resonator device 150 operates in the same manner as the resonator device 120 shown in FIG. 17. Specifically, conductor loss of the resonance electrode 152 is greatly reduced by the sides 153 and 154 of the resonance electrode 152, such that the resulting resonator device has a high Q value.

Figure 20:
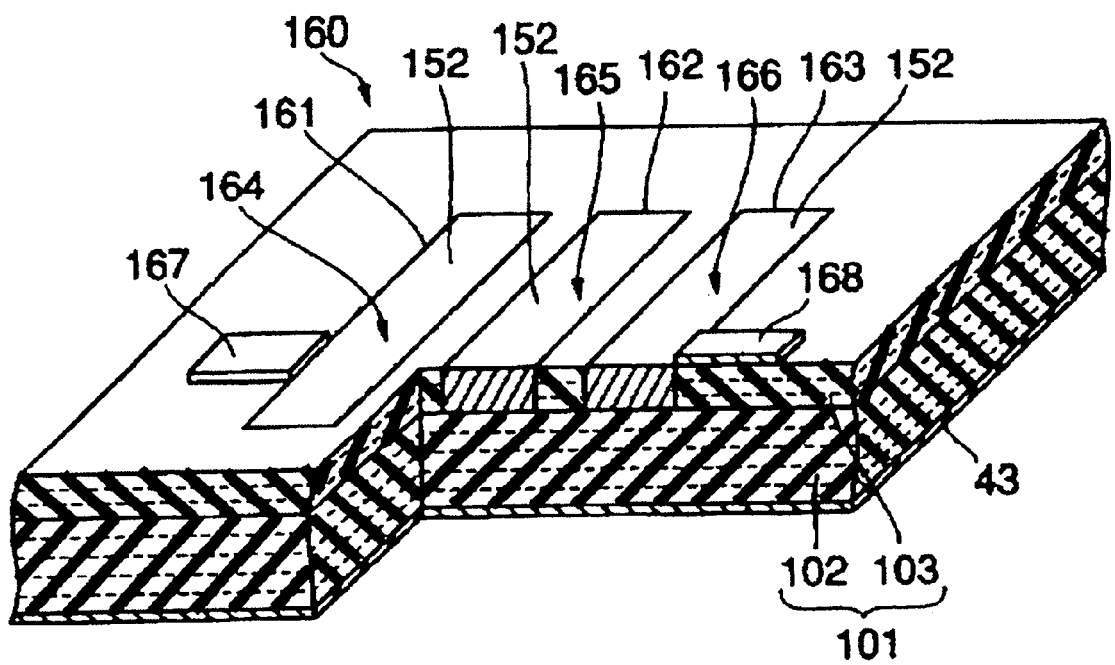
FIG. 20 is a detail cross sectional oblique view illustrating another preferred embodiment of the filter according to the present invention.

FIG. 20 illustrates another preferred embodiment of the filter according to the present invention. Those components that are the same as in the preferred embodiment illustrated in FIG. 19 are numbered the same, and redundant descriptions of common portions are omitted. The characteristic feature of the filter 160 of this preferred embodiment is that three resonator devices are provided on a laminated substrate.

As shown in FIG. 20, three line formation holes 161, 162, and 163 are provided in a lateral row, equidistantly spaced and substantially parallel to the drawing direction, on the second lamination component 103 of the laminated substrate 101. Strip conductors 164, 165, and 166 are formed by filling in these line formation holes 161, 162, and 163, respectively, with a conductive paste. Laminated substrate 101 is provided including a first lamination component 102 and a second lamination component 103. Coupling electrodes 167 and 168 are provided on the front of the second lamination component 103 of the laminated substrate 101.

The coupling electrode 167 is connected to the strip conductor 164 located at the beginning of the strip conductors 164, 165, and 166 arranged in a lateral row, while the coupling electrode 168 is connected to the strip conductor 166 located at the end of this lateral row.

With this configuration, if the coupling electrode 167 is used as the input side and the coupling electrode 168 as the output side, for example, when high-frequency current is input to the coupling electrode 167, just as with the filter 135 shown in FIG. 18, the resonance electrodes 152 of the adjacent strip conductors 164, 165, and 166 are magnetically coupled together, and the various strip conductors 164, 165, and 166 resonate in a coupled mode.

Here, the strip conductors 164, 165, and 166 are each excited with very low energy loss, just as with the resonator device 150 in FIG. 19, such that the Q value is high and the resulting filter provides outstanding performance.

Figure 21:
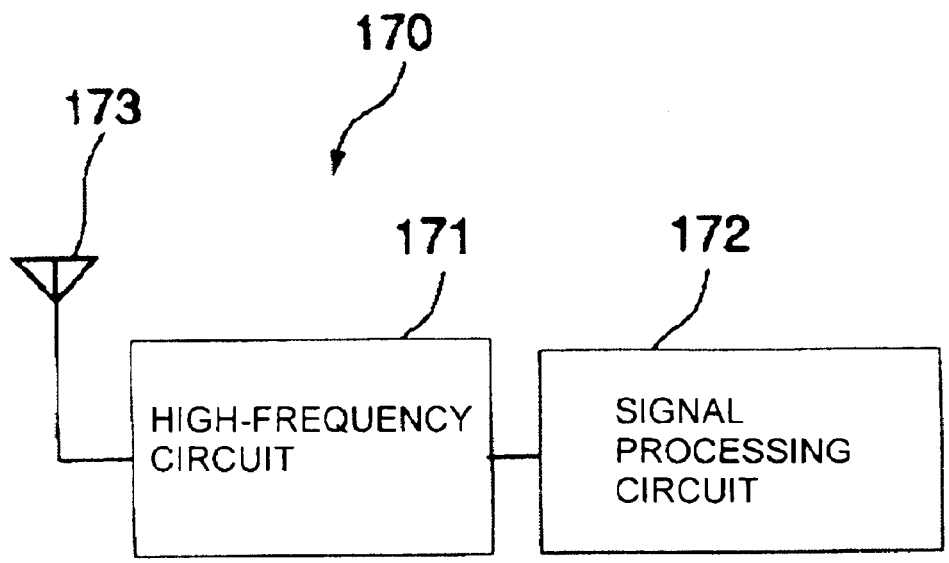
FIG. 21 is a block diagram of a preferred embodiment of the high frequency circuit according to the present invention.

FIG. 21 is a block diagram of a preferred embodiment of a communications device according to the present invention, such as a cellular telephone or other wireless communications device. Specifically, a communications device 170 includes a high frequency circuit 171, a signal processing circuit 172, and an antenna 173. The antenna 173 is connected to the input terminal of the high frequency circuit 171, and the signal processing circuit 172 is connected to the output terminal of the high frequency circuit 171.

The high frequency circuit 171 includes a reception circuit that amplifies the wireless signal (RF signal) received by the antenna 173 and converts it into a baseband signal (IF signal), and a transmission circuit that converts the IF signal output from the signal processing circuit 172 into an RF signal, amplifies the signal, and emits it from the antenna 173 as radio waves. The high-frequency transmission circuit in the high frequency circuit 171 includes the microstrip line of various preferred embodiments of the present invention described above. This greatly reduces transmission loss along the high frequency circuit 171, greatly improves the performance of the communications device, and greatly reduces power consumption.

Figure 22:
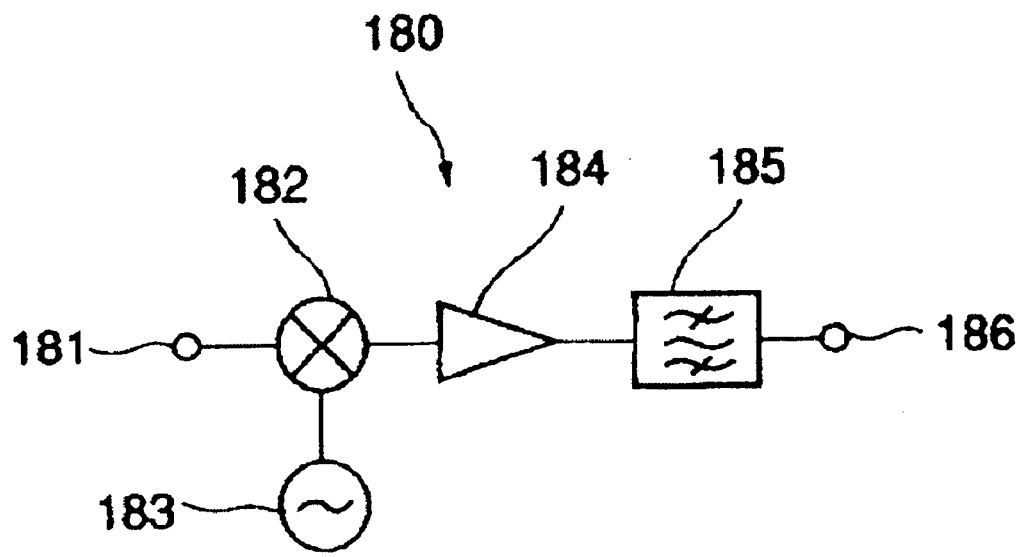
FIG. 22 is a simplified circuit diagram of a transmission circuit illustrating an example of the high frequency circuit according to preferred embodiments of the present invention.

A specific example of the transmission circuit of the high frequency circuit 171 will be described through reference to FIG. 22. A transmission circuit 180 includes an input terminal 181 for inputting an IF signal from the signal processing circuit 172 shown in FIG. 21, a mixer 182 that is connected to the input terminal 181 and converts an IF signal into an RF signal, a local oscillator 183 for supplying a carrier signal to the mixer 182, a power amplifier 184 for boosting the power of the RF signal outputted from the mixer 182, a bandpass filter 185 for removing unnecessary signals from the amplified RF signal, and an output terminal 186 for outputting the RF signal from the bandpass filter 185 to the antenna 173.

In the above transmission circuit 180, the IF signal input to the input terminal 181 is converted into an RF signal by the mixer 182. This RF signal is amplified by the power amplifier 184 and passes through the bandpass filter 185, after which it is emitted from the antenna 173 as radio waves.

In the above-mentioned transmission circuit 180, the microstrip lines 40, 50, 55, 60, 65, 75, 100, and the resonator devices 120 and 150 of various preferred embodiments of the present invention can be used for the local oscillator 183, the microstrip lines 40, 50, 55, 60, 65, 75, 100 of the present invention can be used for the power amplifier 184, and the filters 135 and 160 of the present invention can be used for the bandpass filter 185. Using these components greatly improves the performance of the local oscillator 183, increases the gain, lowers the noise, and reduces the power consumption of the power amplifier 184, and further, greatly improves the performance and reduces loss in the bandpass filter 185.

The above-described high frequency circuit 171 is produced, for example, by blocking together electronic circuits, such as reception circuits and transmission circuits into a circuit module. Specifically, a circuit module is produced by cutting the dielectric substrate 41 down to a small surface area, and forming only the transmission circuit 180 shown in FIG. 22 on this small substrate. This configuration allows the reception circuit, which must have low noise, and the transmission circuit, which must have high power, to be separated.

The high frequency circuit, electronic circuit, and circuit module of various preferred embodiments of the present invention are not limited to a communications device, and can be included in a variety of electronic devices in which one of the microstrip lines, resonator devices, or filters of the present invention are used.

With the microstrip line of various preferred embodiments of the present invention, edge electrodes are provided along the entire length of the line electrode at the edges thereof, and the high frequency current that would otherwise concentrate at the edges of the line electrode is dispersed, such that the edge effect of the line electrode is greatly reduced, and conductor loss in the line electrode is also greatly reduced.

When the microstrip line of preferred embodiments of the present invention is used, a resonator device with a greatly increased Q value is obtained, and the use of this resonator device greatly improves the performance and greatly reduces the loss of a filter, and also affords a high frequency circuit in which the transmission loss of the transmission line is greatly reduced.

Furthermore, using the microstrip line, resonator device, or filter of preferred embodiments of the present invention provides an electronic circuit or circuit module having outstanding performance, and with a communications device, the communications quality is greatly improved and power consumption is greatly reduced.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A microstrip line, comprising:
    a dielectric substrate having a front surface and a back surface;
    a ground electrode provided on the back surface of said dielectric substrate; and
    a line electrode provided on the front surface of the dielectric substrate; wherein
    edge electrodes are provided at edges on both sides of the line electrode;
    said edge electrodes are arranged substantially perpendicular to the front surface of the dielectric substrate; and
    the line electrode is defined by only a single layer electrode.

2. The microstrip line according to claim 1, wherein a reinforcing layer overlaps the front surface of the dielectric substrate and is made of a material with a small dielectric loss tangent, such that the reinforcing layer supports the edge electrodes.

3. The microstrip line according to claim 1, wherein a pair of reinforcing components made of a material having a small dielectric loss are provided on the front surface of the dielectric substrate to support the edge electrodes.

4. The microstrip line according to claim 3, wherein the reinforcing components are defined by insulating films made of a resin material.

5. The microstrip line according to claim 3, wherein the reinforcing components are made of a ceramic material.

6. The microstrip line according to claim 3, wherein a line groove is provided between the pair of reinforcing components, with the front surface of the dielectric substrate defining a bottom of the groove, said line groove includes sides that are substantially perpendicular to the front surface of the dielectric substrate, the line electrode is provided at the bottom of the line groove, and the edge electrodes are linked along the entire length of the line electrode and the edges of the line electrode are located on the sides of the line groove.

7. A microstrip line, comprising:
  a dielectric substrate having a front surface and a back surface;
  a ground electrode provided on the back surface of said dielectric substrate; and
  a line electrode provided on the front surface of the dielectric substrate; wherein
  edge electrodes are provided at edges on both sides of the line electrode;
  said edge electrodes are disposed at an angle relative to the front surface of the dielectric substrate; and
  the line electrode is defined by only a single layer electrode.

8. The microstrip line according to claim 7, wherein a pair of reinforcing components made of a material having a small dielectric loss are provided on the front surface of the dielectric substrate to support the edge electrodes.

9. The microstrip line according to claim 8, wherein the reinforcing components are defined by insulating films made of a resin material.

10. The microstrip line according to claim 8, wherein the reinforcing components are made of a ceramic material.

11. The microstrip line according to claim 8, wherein a line groove is provided between the pair of reinforcing components, with the front surface of the dielectric substrate defining a bottom of the groove, said line groove includes sides that are substantially perpendicular to the front surface of the dielectric substrate, the line electrode is provided at the bottom of the line groove, and the edge electrodes are linked along the entire length of the line electrode and the edges of the line electrode are located on the sides of the line groove.

12. The microstrip line according to claim 7, wherein a reinforcing layer overlaps the front surface of the dielectric substrate and is made of a material with a small dielectric loss tangent, such that the reinforcing layer supports the edge electrodes.

* * * * *